United States Patent
Hung et al.

(10) Patent No.: US 11,569,223 B2
(45) Date of Patent: Jan. 31, 2023

(54) INTEGRATED CIRCUIT AND METHOD FOR FABRICATING THE SAME

(71) Applicant: TAIWAN SEMICONDUCTOR MANUFACTURING CO., LTD., Hsinchu (TW)

(72) Inventors: Tao-Yi Hung, Hsinchu (TW); Wun-Jie Lin, Hsinchu (TW); Jam-Wem Lee, Hsinchu (TW); Kuo-Ji Chen, New Taipei (TW); Chia-En Huang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/086,076

(22) Filed: Oct. 30, 2020

(65) Prior Publication Data

US 2022/0139903 A1 May 5, 2022

(51) Int. Cl.
*H01L 27/02* (2006.01)
*H01L 21/8238* (2006.01)
*H01L 27/092* (2006.01)

(52) U.S. Cl.
CPC .. *H01L 27/0255* (2013.01); *H01L 21/823821* (2013.01); *H01L 21/823828* (2013.01); *H01L 27/0924* (2013.01)

(58) Field of Classification Search
CPC ......... H01L 27/0255; H01L 21/823821; H01L 21/823828; H01L 27/0924
See application file for complete search history.

(56) References Cited

U.S. PATENT DOCUMENTS

| | | | |
|---|---|---|---|
| 9,209,247 B2 | 12/2015 | Colinge et al. | |
| 9,236,267 B2 | 1/2016 | De et al. | |
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0151731 A1* | 5/2018 | Lee | H01L 29/66795 |
| 2019/0131395 A1* | 5/2019 | Lee | H01L 29/161 |
| 2020/0365733 A1* | 11/2020 | Song | H01L 29/42392 |
| 2020/0403007 A1* | 12/2020 | Thomson | H01L 21/84 |

* cited by examiner

*Primary Examiner* — Karen Kusumakar
*Assistant Examiner* — Adam S Bowen
(74) *Attorney, Agent, or Firm* — Birch, Stewart, Kolasch & Birch, LLP

(57) ABSTRACT

A method for fabricating an integrated circuit is provided. The method includes etching a first recess in a semiconductor structure; forming a first doped epitaxial feature in the first recess; and forming a second doped epitaxial feature over the first doped epitaxial feature, wherein the second doped epitaxial feature has a conductive type opposite to a conductive type of the first doped epitaxial feature.

20 Claims, 29 Drawing Sheets

INTEGRATED CIRCUIT AND METHOD FOR FABRICATING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

With scaled-down device dimensions, IC products have become more susceptible to electrostatic discharge (ESD)-caused damage. Therefore, the ESD protection circuit has been built on the chip to protect devices and circuits against ESD damage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
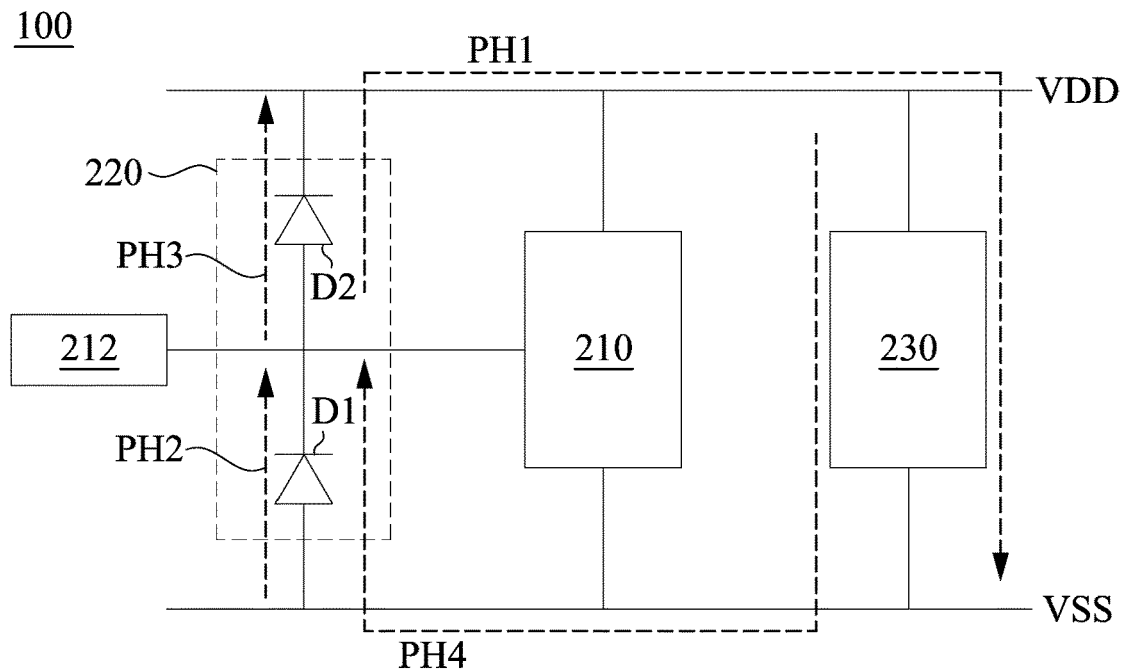
FIG. 1 illustrates a simplified system diagram of a circuit with an electrostatic discharge (ESD) protection circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Diode structures can be used in integrated circuits for the electrostatic discharge protection, thereby preventing the failure of the devices. The diode structure and method of fabricating the same are provided in accordance with various embodiments. The intermediate stages of forming the diode structure are illustrated. The variations and the operation of the embodiments are discussed. Throughout the various views and illustrative embodiments, like reference numbers are used to designate like elements.

The diode structure may be compatible to the process flow of transistor devices, such as multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a gate all around (GAA) device or a nanosheet device having gate material disposed on at least four sides of at least one channel of the device. The channel region may be referred to as a "nanowire," which as used herein includes channel regions of various geometries (e.g., cylindrical, bar-shaped) and various dimensions. In some examples, the multi-gate device may be referred to as a FinFET device. However, one of ordinary skill would recognize that the teaching can apply to a single channel (e.g., single nanosheet) or any number of channels. One of ordinary skill may recognize other examples of semiconductor devices that may benefit from aspects of the present disclosure.

Structures of the GAA device or the nanosheet device may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Semiconductor fabrication of ICs includes, for example, front-end-of-line (FEOL), middle-end-of-line (MEOL) process, and back-end-of-line (BEOL) processes. FEOL encompasses processes related to fabricating IC devices, such as transistors. For example, FEOL process can include forming isolation features, gate structures, and source/drain features. MEOL process can include processes related to fabricating contacts to conductive features (or conductive regions) of the IC devices, such as contacts to the gate structures and/or the source/drain features. BEOL process includes processes related to fabricating a multilayer interconnect (MLI) feature that interconnects IC features fabricated by FEOL and MEOL process.

FIG. 1 illustrates a simplified system diagram of a circuit 100 with an electrostatic discharge (ESD) protection circuit 220 in accordance with some embodiments of the present disclosure. An internal circuit 210 has an input/output pad 212, for example, connecting with a package pin. The ESD protection circuit 220 may be formed by the diodes D1 and D2. The diode D1 is connected between an input/output pad 212 to VSS, and the diode D2 is connected between the input/output pad 212 to VDD. An ESD power-clamp circuit 230 is placed between VSS and VDD to provide low resistance path during ESD events when needed. In some embodiments, the ESD power clamp circuit 230 is constructed by RC-invertor and a BigFET. Through the ESD power-clamp circuit 230, ESD protection can be achieved under VDD-to-VSS (or VSS-to-VDD) ESD stress, as well as different ESD stress conditions from the input/output to VDD/VSS, including positive-to-VSS (PS) mode, negative-to VSS (NS) mode, positive-to-VDD (PD) mode, and negative-to VDD (ND) mode. The PS mode, NS mode, PD mode, and the ND mode are respectively indicated as the paths PH1-PH4. Therefore, the ESD protection circuit 220 and the ESD power-clamp circuit 230 can provide efficient protection to the internal circuit 210.

Figure 2:
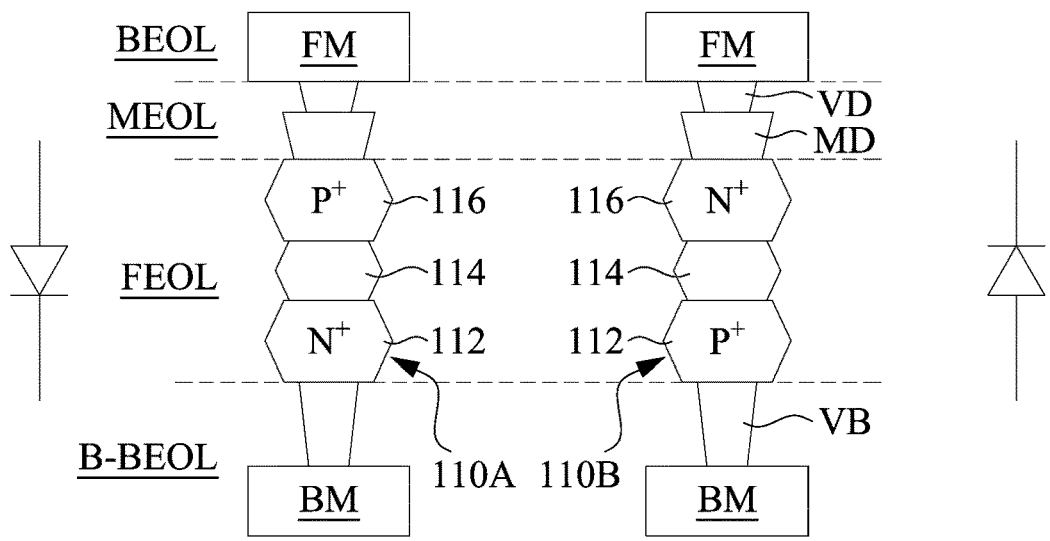
FIG. 2 is a schematic cross-sectional view of semiconductor structures in accordance with some embodiments of the present disclosure.

FIG. 2 is a schematic cross-sectional view of semiconductor structures 110A and 110B in accordance with some embodiments of the present disclosure. The semiconductor structure 110A/110B may form the diode D1/D2 in the ESD protection circuit 220 in FIG. 1. Diode symbols of the semiconductor structures 110A and 110B are also shown in the figure for illustration. In some embodiments, each of the semiconductor structures 110A and 110B includes a first doped epitaxial feature 112, an intrinsic epitaxial feature 114 over the first doped epitaxial feature 112, and a second doped epitaxial feature 116 over the intrinsic epitaxial feature 114.

In the present embodiments, the first doped epitaxial feature 112, the intrinsic epitaxial feature 114, and the second doped epitaxial feature 116 of the respective semiconductor structure 110A/110B forms a PIN junction. In some other embodiments, the intrinsic epitaxial feature 114 may be omitted, and the first doped epitaxial feature 112 and the second-doped epitaxial feature 116 of the respective semiconductor structure 110A/110B forms a PN junction.

In some embodiments, the first and second doped epitaxial features 112 and 116 of the respective semiconductor structure 110A/110B are of opposite conductive types. For example, the first doped epitaxial feature 112 of the semiconductor structure 110A is doped by an n-type dopant, such as, but not limited to, phosphorus (P), arsenic (As), or a combination thereof. The first doped epitaxial feature 112 of the semiconductor structure 110A may have an n-type impurity concentration higher than about $10^{18}/cm^3$. The second doped epitaxial feature 116 of the semiconductor structure 110A is doped by a p-type dopant, such as, but not limited to, boron (B), gallium (Ga), indium (In), and combinations thereof. The second doped epitaxial feature 116 of the semiconductor structure 110A may have a p-type impurity concentration higher than about $10^{18}/cm^3$.

On the other hand, the first doped epitaxial feature 112 of the semiconductor structure 110B is doped by a p-type dopant, such as, but not limited to, boron (B), gallium (Ga), indium (In), and combinations thereof. The first doped epitaxial feature 112 of the semiconductor structure 110B may have a p-type impurity concentration higher than about $10^{18}/cm^3$. The second doped epitaxial feature 116 of the semiconductor structure 110B is doped by an n-type dopant, such as, but not limited to, phosphorus (P), arsenic (As), or a combination thereof. The second doped epitaxial feature 116 of the semiconductor structure 110B may have an n-type impurity concentration higher than about $10^{18}/cm^3$.

In some embodiments, the intrinsic epitaxial feature 114 is not intentionally doped, for example, not having intentionally placed dopants, but rather having a doping resulting from process contaminants. For example, the intrinsic epitaxial feature 114 is not intentional doped (NID) semiconductor layers and thus free from the dopants in the first and second doped epitaxial features 112 and 116. Alternatively, the intrinsic epitaxial feature 114 may be doped with a p-type or an n-type, and with a doping concentration lower than that of the first and second doped epitaxial features 112 and 116. For example, the intrinsic epitaxial feature 114 have dopant concentration lower than about $10^{13}/cm^3$.

In some embodiments, the epitaxial features 112-116 of the semiconductor structure 110A/110B are stacked vertically in the FEOL layer, and connected to the internal circuit 210 (as shown in FIG. 1) through the metallization patterns in other layers. For example, the second-doped epitaxial feature 116 is connected with a frontside metal line FM in the BEOL layer through a contact MD and a frontside vias VD in the MEOL layer, and the first doped epitaxial feature 112 is connected with a backside metal line BM in the backside-BEOL (B-BEOL) layer through a backside contact via VB. The frontside metal lines FM and the backside metal lines BM may be designed by suitable routing designs for realizing the circuit shown in FIG. 1. For example, in some embodiments, the frontside metal lines FM and/or the backside metal lines BM may serve as the power rails VSS and VDD shown in FIG. 1, and signal/power pins can be bump out at the back-side of the wafer. In the present embodiments, the FEOL, MEOL, and BEOL layers are respectively directed to the FEOL, MEOL, and BEOL process. The B-BEOL layer is directed to a B-BEOL process includes processes related to fabricating a multilayer interconnect (MLI) feature at backside that interconnects IC features.

FIGS. 3-22 illustrate various stages of manufacturing an integrated circuit 300 according to some embodiments of the present disclosure. The illustration is merely exemplary and is not intended to limit beyond what is specifically recited in the claims that follow. It is understood that additional operations may be provided before, during, and after the operations shown by FIGS. 3-22, and some of the operations described below can be replaced or eliminated for additional embodiments of the method. The order of the operations/processes may be interchangeable.

Figure 3:
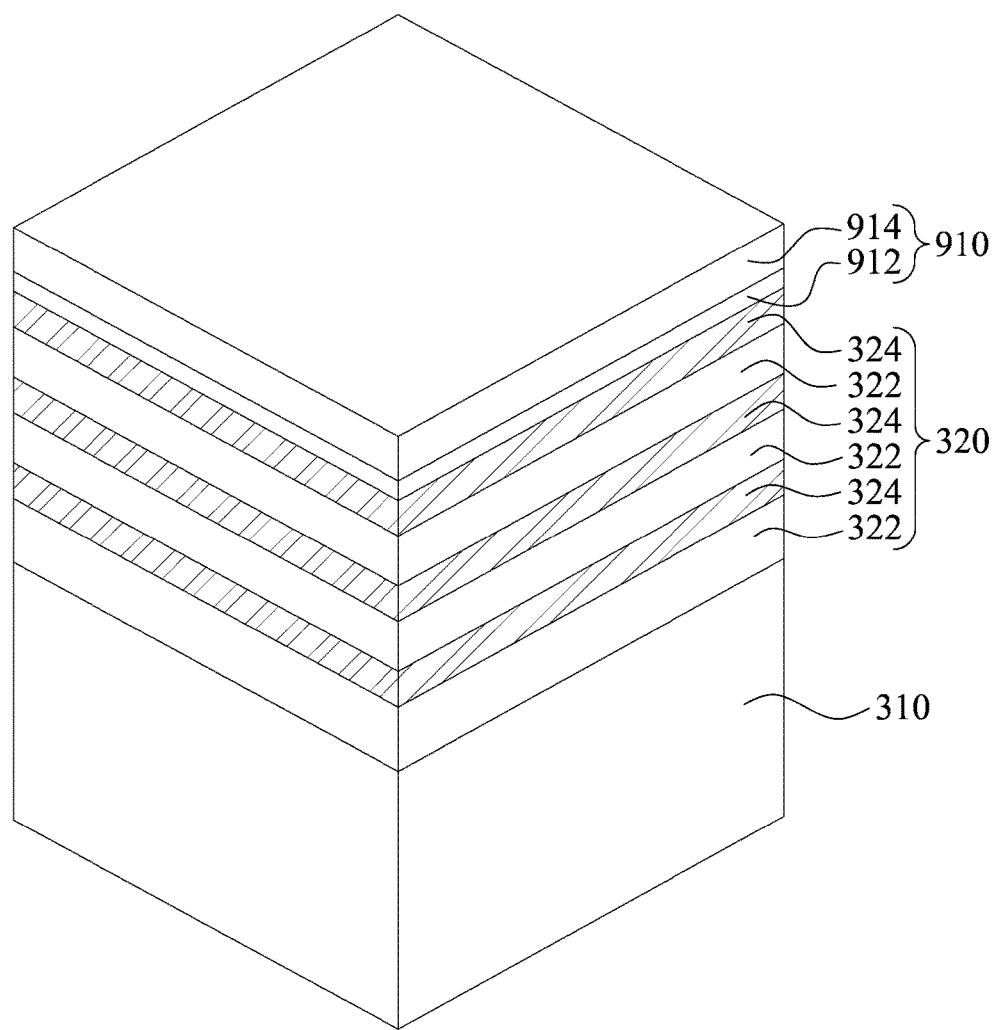
FIGS. 3-22 illustrate various stages of manufacturing an integrated circuit according to some embodiments of the present disclosure.
Figure 3:
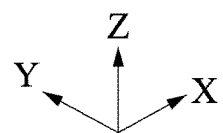

Referring to FIG. 3, an epitaxial stack 320 is formed over the substrate 310. In some embodiments, the substrate 310 may include silicon (Si). Alternatively, the substrate 310 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 310 may include a semiconductor-on-insulator (SOI) structure such as a buried dielectric layer. Also alternatively, the substrate 310 may include a buried dielectric layer such as a buried oxide (BOX) layer, such as that formed by a method referred to as separation by implantation of oxygen (SIMOX) technology, wafer bonding, selective epitaxial growth (SEG), or another appropriate method.

The epitaxial stack 320 includes epitaxial layers 322 of a first composition interposed by epitaxial layers 324 of a second composition. The first and second compositions can be different. In some embodiments, the epitaxial layers 322 are SiGe and the epitaxial layers 324 are silicon (Si). However, other embodiments are possible including those that provide for a first composition and a second composition having different oxidation rates and/or etch selectivity. In some embodiments, the epitaxial layers 322 include SiGe and where the epitaxial layers 324 include Si, the Si oxidation rate of the epitaxial layers 324 is less than the SiGe oxidation rate of the epitaxial layers 322.

The epitaxial layers 324 or portions thereof may form nanosheet channel(s) of the multi-gate transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 324 to define a channel or channels of a device is further discussed below.

It is noted that three layers of the epitaxial layers 322 and three layers of the epitaxial layers 324 are alternately arranged as illustrated in FIG. 3, which is for illustrative purposes only and not intended to be limiting beyond what is specifically recited in the claims. It can be appreciated that any number of epitaxial layers can be formed in the epitaxial stack 320; the number of layers depending on the desired number of channels regions for the transistor. In some embodiments, the number of epitaxial layers 324 is between 2 and 10.

The epitaxial layers 322 in channel regions(s) may eventually be removed and serve to define a vertical distance between adjacent channel region(s) for a subsequently-formed multi-gate device. Accordingly, the epitaxial layers 322 may also be referred to as sacrificial layers, and epitaxial layers 324 may also be referred to as channel layers.

By way of example, epitaxial growth of the layers of the stack 320 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 324 include the same material as the substrate 310. In some embodiments, the epitaxially grown layers 322 and 324 include a different material than the substrate 310. As stated above, in at least some examples, the epitaxial layers 322 include an epitaxially grown silicon germanium (SiGe) layer and the epitaxial layers 324 include an epitaxially grown silicon (Si) layer. Alternatively, in some embodiments, either of the epitaxial layers 322 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 322 and 324 may be chosen based on providing differing oxidation and/or etching selectivity properties. In some embodiments, the epitaxial layers 322 and 124 are substantially dopant-free (i.e., having an extrinsic dopant concentration from about 0 $cm^{-3}$ to about $1\times10^{18}$ $cm^{-3}$), where for example, no intentional doping is performed during the epitaxial growth process.

Figure 4:
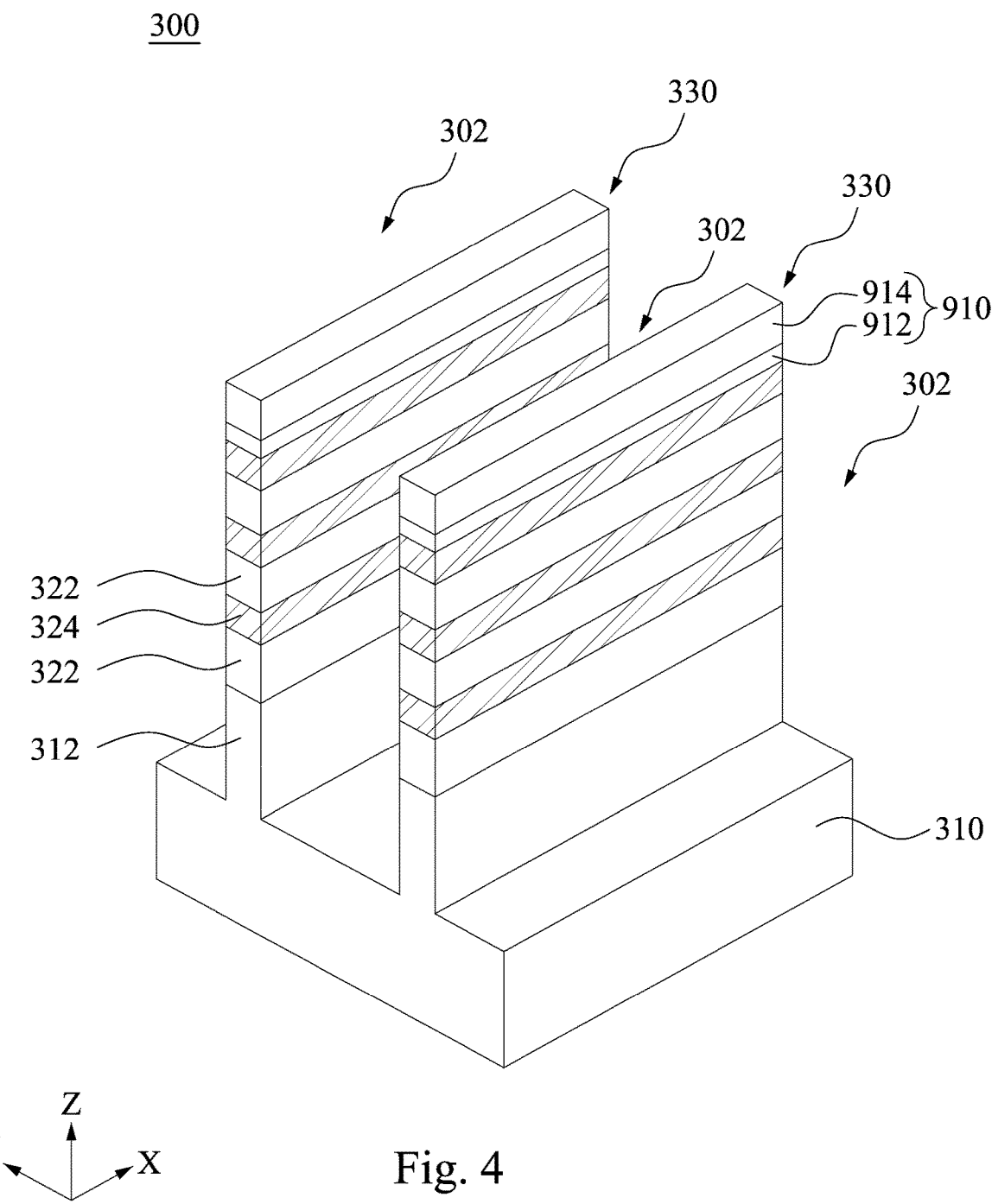

Referring to FIG. 4, a plurality of semiconductor fins 330 extending from the substrate 310 are formed. In various embodiments, each of the fins 330 includes a substrate portion 312 formed from the substrate 310 and portions of each of the epitaxial layers of the epitaxial stack 320 including epitaxial layers 322 and 324. The fins 330 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 330 by etching initial epitaxial stack 320. The etching process can include dry etching, wet etching, reactive ion etching (RIE), and/or other suitable processes.

In the illustrated embodiment as illustrated in FIGS. 3 and 4, a hard mask (HM) layer 910 is formed over the epitaxial stack 320 prior to patterning the fins 330. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 320 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 330 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 310, and layers formed thereupon, while an etch process forms trenches 302 in unprotected regions through the HM layer 910, through the epitaxial stack 320, and into the substrate 310, thereby leaving the plurality of extending fins 330. The trenches 302 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 320 in the form of the fins 330.

Figure 5:
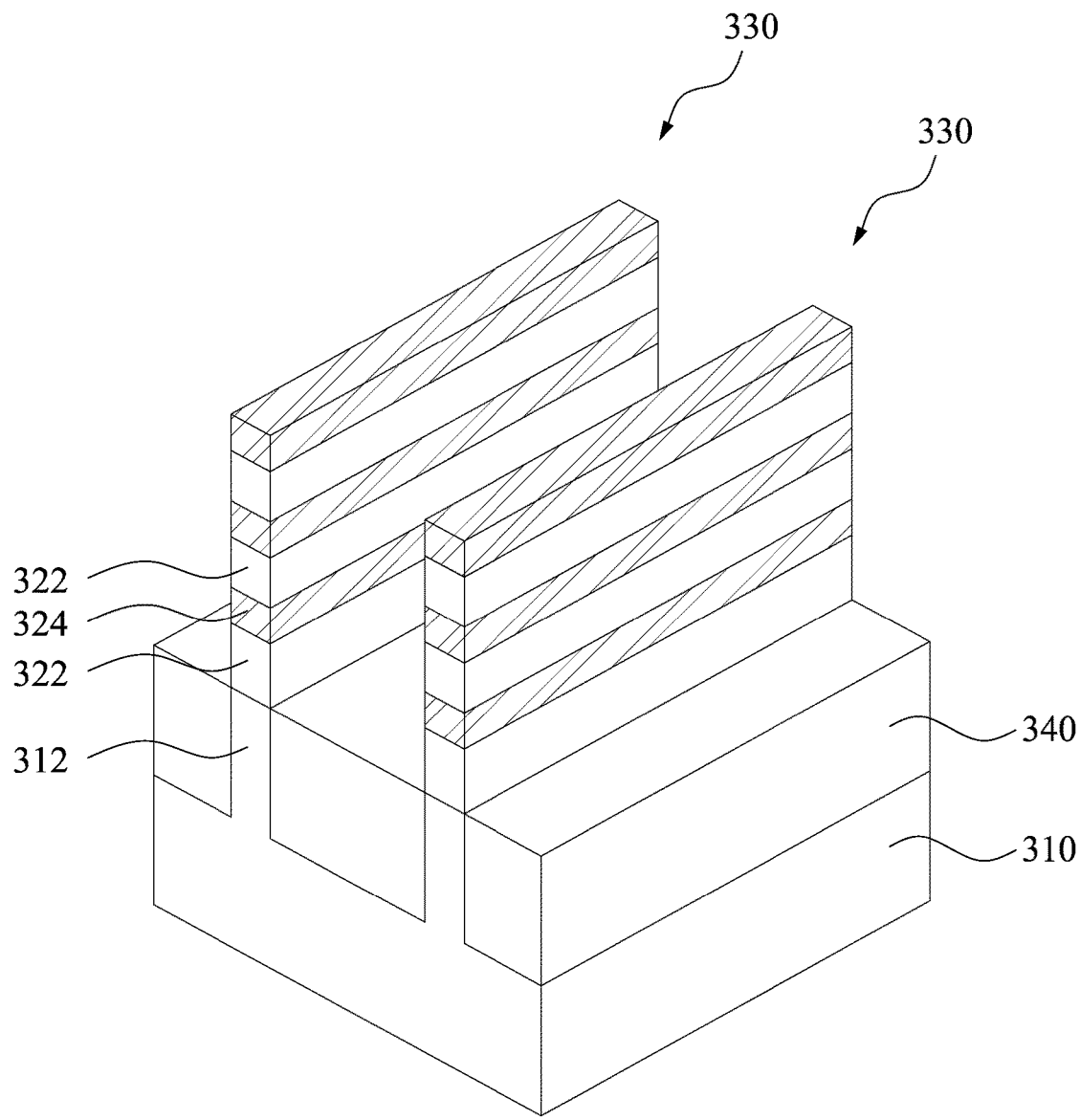

Referring to FIG. 5, shallow trench isolation (STI) features 340 are formed interposing the fins 330. By way of example and not limitation, a dielectric layer is first deposited over the substrate 310, filling the trenches 302 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, the dielectric layer (and subsequently formed STI features 340) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 (as illustrated FIG. 3) functions as a CMP stop layer. The STI features 340 interposing the fins 330 are recessed. Referring to the example of FIG. 5, the STI features 340 are recessed providing the fins 330 extending above the STI features 340. In some embodiments, the recessing process may include a dry etching process, a wet etching process, and/or a combination thereof. The HM layer 910 may also be removed before, during, and/or after the recessing of the STI features 340. The nitride layer 914 of the HM layer 910 may be removed, for example, by a wet etching process using $H_3PO_4$ or other suitable etchants. In some embodiments, the oxide layer 912 of the HM layer 910 is removed by the same etchant used to recess the STI features 340. In some embodiments, a recessing depth is controlled (e.g., by controlling an etching time) so as to result in a desired height of the exposed upper portion of the fins 330. In the illustrated embodiment, the desired height exposes each of the layers of the epitaxial stack 320 in the fins 330.

Figure 6A:
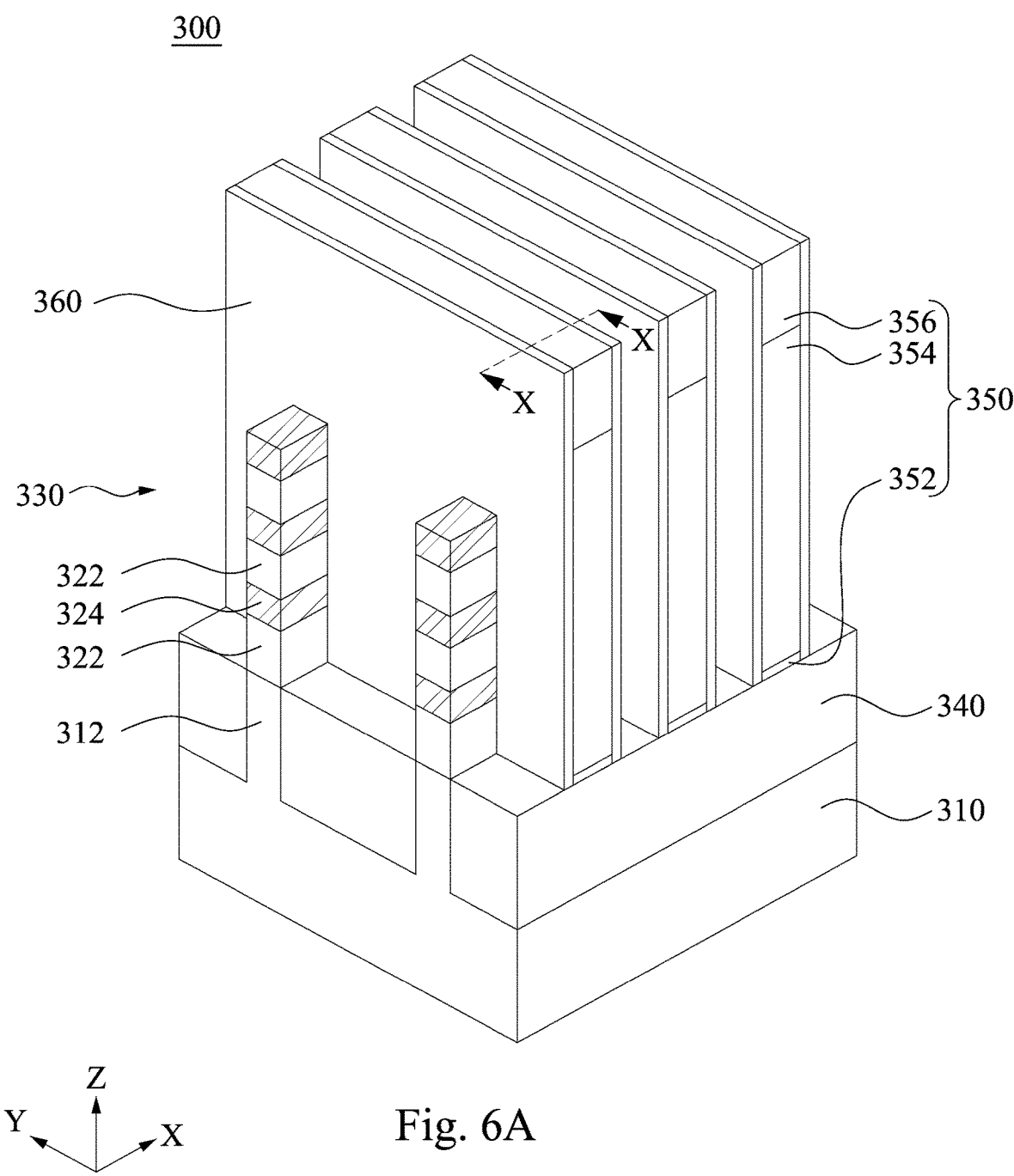

Referring to FIG. 6A, gate structures 350 are formed. In some embodiments, the gate structures 350 are dummy (sacrificial) gate structures that are subsequently removed. Thus, in some embodiments using a gate-last process, the gate structures 350 are dummy gate structures and will be replaced by the final gate structures at a subsequent processing stage of the integrated circuit 300. In particular, the dummy gate structures 350 may be replaced at a later processing stage by a high-k dielectric layer (HK) and metal gate electrode (MG) as discussed below. In some embodiments, the dummy gate structures 350 are formed over the substrate 310 and are at least partially disposed over the fins 330. The portion of the fins 330 underlying the dummy gate structures 350 may be referred to as the channel region. The dummy gate structures 350 may also define a source/drain (S/D) region of the fins 330, for example, the regions of the fin 330 adjacent and on opposing sides of the channel region.

In the illustrated embodiment, the formation of the gate structures 350 first forms a dummy gate dielectric layer 352 over the fins 330. In some embodiments, the dummy gate dielectric layer 352 may include $SiO_2$, silicon nitride, a high-k dielectric material and/or other suitable material. In various examples, the dummy gate dielectric layer 352 may be deposited by a CVD process, a subatmospheric CVD (SACVD) process, a flowable CVD process, an ALD process, a PVD process, or other suitable process. By way of example, the dummy gate dielectric layer 352 may be used to prevent damages to the fins 330 by subsequent processes (e.g., subsequent formation of the dummy gate structure). Subsequently, the formation of the gate structures 350 forms a dummy gate electrode layer 354 and a hard mask 356 which may include multiple layers (e.g., an oxide layer and a nitride layer). In some embodiments, the dummy gate structure 350 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 354 may include polycrystalline silicon (polysilicon). In some embodiments, the hard mask 356 includes an oxide layer such as a pad oxide layer that may include $SiO_2$, and a nitride layer such as a pad nitride layer that may include $Si_3N_4$ and/or silicon oxynitride. In some embodiments, after patterning the dummy gate electrode layer 354, the dummy gate dielectric layer 352 is removed from the S/D regions of the fins 330. The etch process may include a wet etch, a dry etch, and/or a combination thereof. The etch process is chosen to selectively etch the dummy gate dielectric layer 352 without substantially etching the fins 330, the dummy gate electrode layer 354, and the hard mask 356.

After the formation of the dummy gate structures 350, gate spacers 360 are formed on sidewalls of the dummy gate structures 350. For example, a spacer material layer is conformally deposited on the substrate using processes such as, CVD process, a subatmospheric CVD (SACVD) process, a flowable CVD process, an ALD process, a PVD process, or other suitable process. The spacer material layer may include a dielectric material such as silicon oxide, silicon nitride, silicon carbide, silicon oxynitride, SiCN films, silicon oxycarbide, SiOCN films, and/or combinations thereof. The spacer material layer is subsequently etched back to form the gate spacers 160. For example, an anisotropic etching process is performed on the deposited spacer material layer to expose portions of the fins 330 not covered by the dummy gate structures 350 (e.g., in source/drain regions of the fins 330). Portions of the spacer material layer directly above the dummy gate structures 350 may be completely removed by this anisotropic etching process. In some embodiments, the spacer material layer 160 includes multiple layers, and therefore the gate spacers 360 may be multilayer structures.

Figure 6B:
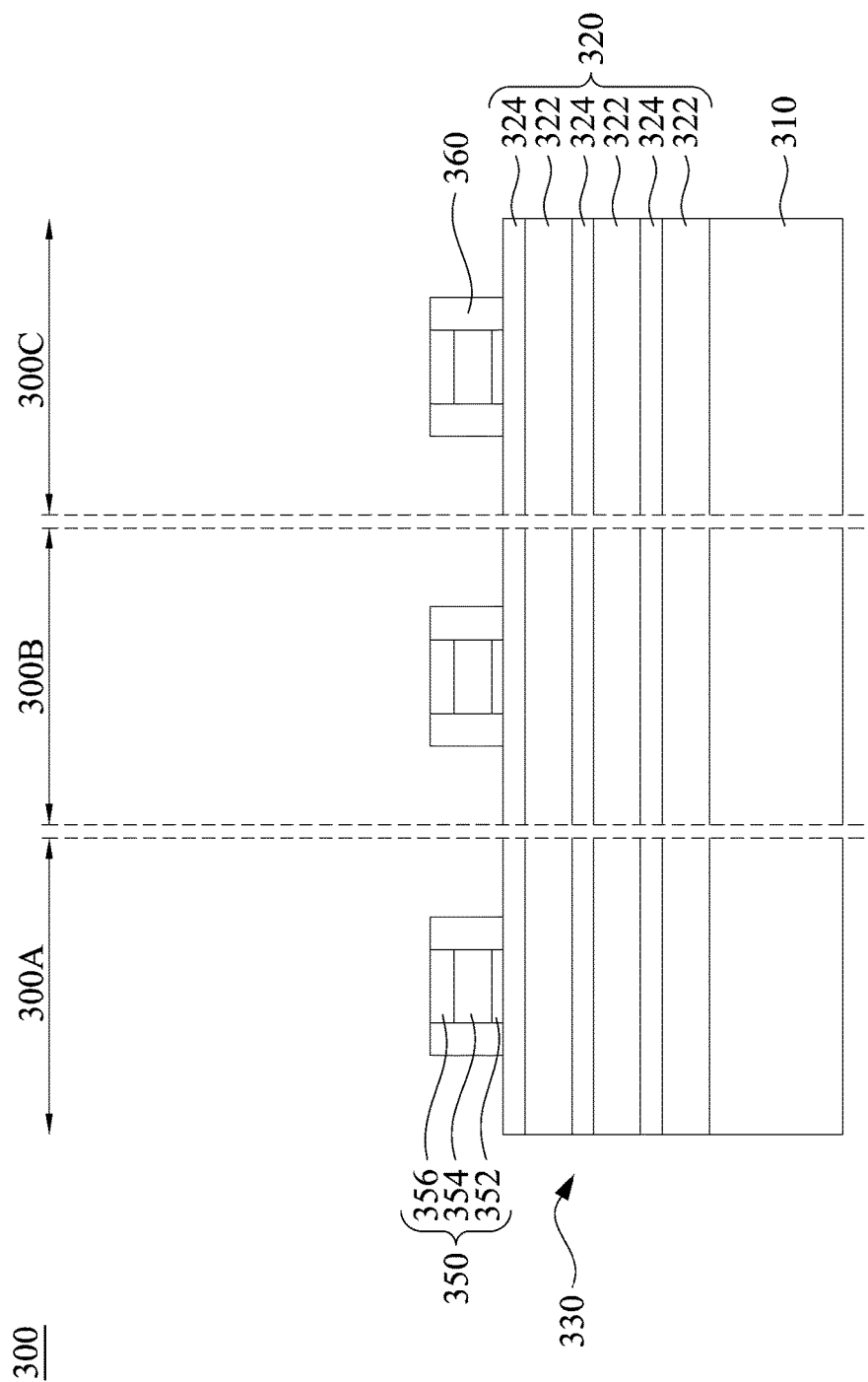

FIG. 6B shows a cross-sectional view of the integrated circuit 300 at an intermediate stage of the fabricating method according to some embodiments of the present disclosure. The integrated circuit 300 may have regions 300A, 300B, and 300C. It is noted that each of the regions 300A, 300B, and 300C in FIG. 6B may be a cross-sectional view taken along line X-X of FIG. 6A, and the regions 300A, 300B, and 300C are not necessarily adjoining each other. For example, there may be a same fin 300 in the regions 300A, 300B, and 300C in some embodiments. In some other embodiments, there may be different fins 330 respectively in the regions 300A, 300B, and 300C. The region 300A may correspond to a region where a diode structure is to be formed. The region 300B may correspond to a region where a PFET device is to be formed. The region 300C may correspond to a region where a NFET device is to be formed. In some embodiments, the diode structure formed in the region 300A may form the ESD protection circuit 220 in FIG. 1, and the PFET device and the NFET device in the regions 300B and 300C may form the internal circuit 210 in FIG. 1.

Figure 7:
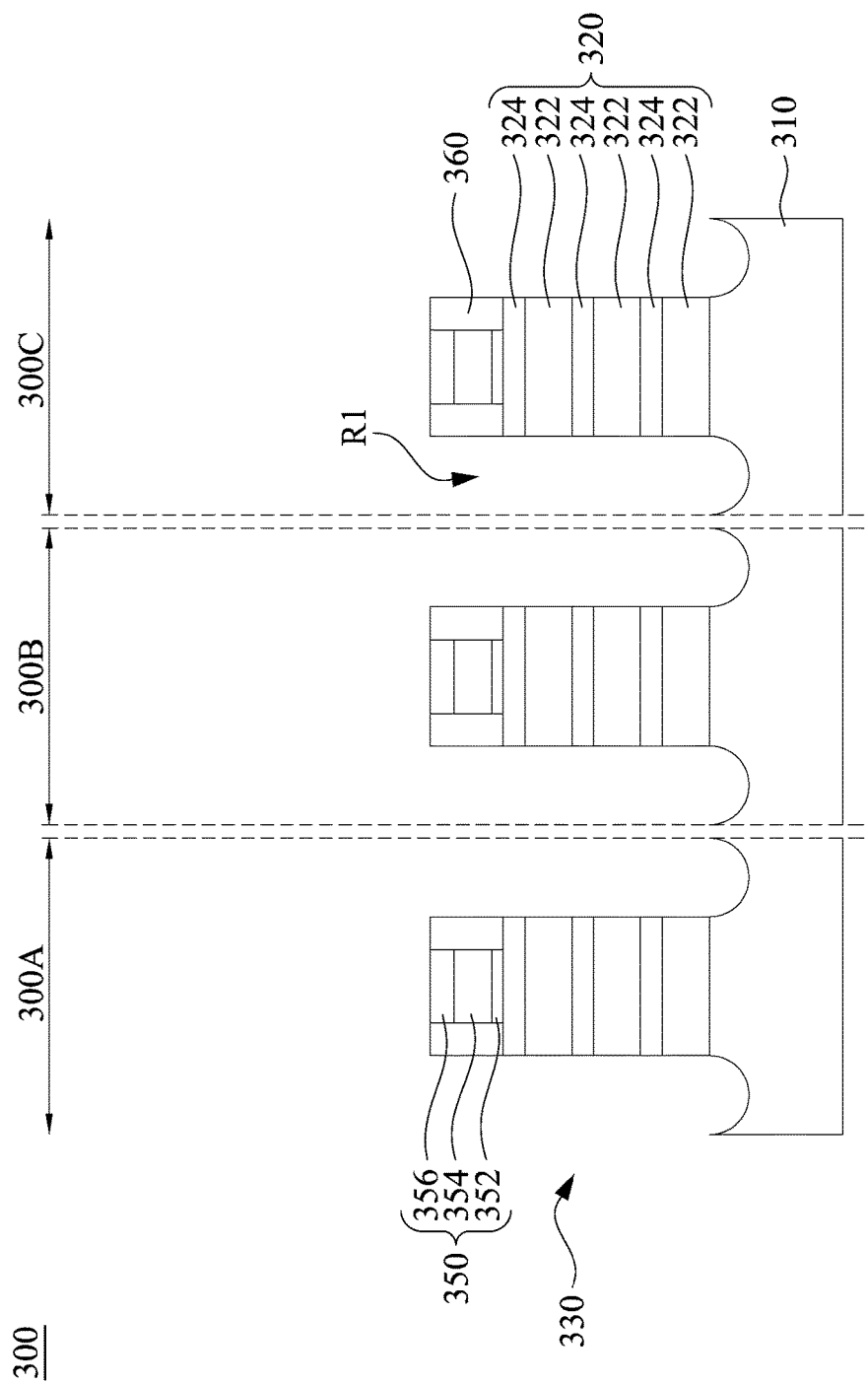

FIGS. 7-22 are cross-sectional views of the integrated circuit structure 300 at intermediate stages of the fabricating method taken along the same cut as in FIG. 6B. Referring to FIG. 7, exposed portions of the semiconductor fins 330 that extend laterally beyond the gate spacers 360 (e.g., in source/drain regions of the fins 330) are etched by using, for example, an anisotropic etching process that uses the dummy gate structure 350 and the gate spacers 360 as an etch mask, resulting in recesses R1 into the semiconductor fins 330 and between corresponding dummy gate structures 350. After the anisotropic etching, end surfaces of the sacrificial layers 322 and channel layers 324 are aligned with respective outermost sidewalls of the gate spacers 360, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 8:
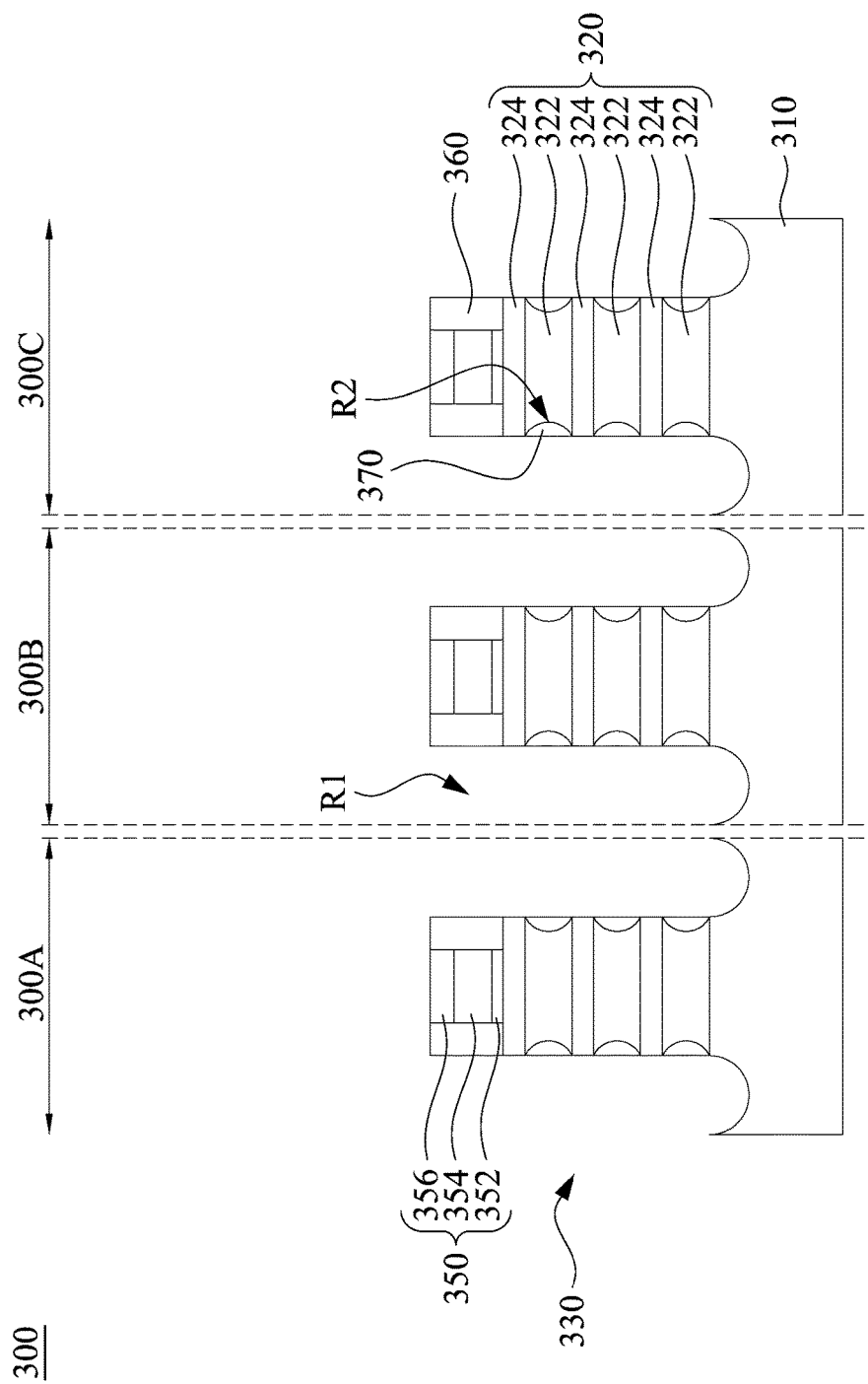

Referring to FIG. 8, the sacrificial layers 322 are laterally or horizontally recessed by using suitable selective etching process, resulting in lateral recesses R2 each vertically between corresponding channel layers 324. By way of example and not limitation, the sacrificial layers 322 are SiGe and the channel layers 324 are silicon allowing for the selective etching of the sacrificial layers 322. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 324 is not significantly etched by the process of laterally recessing the sacrificial layers 322. As a result, the channel layers 324 laterally extend past opposite end surfaces of the sacrificial layers 322.

Inner spacers 370 are subsequently formed on opposite end surfaces of the laterally recessed sacrificial layers 322. In some embodiments, an inner spacer material layer is formed to fill the recesses R2. The inner spacer material layer may be a low-K dielectric material, such as $SiO_2$, SiN, SiCN, or SiOCN, and may be formed by a suitable deposition method, such as ALD. After the deposition of the inner spacer material layer, an anisotropic etching process may be performed to trim the deposited inner spacer material, such that only portions of the deposited inner spacer material that fill the recesses R2 left by the lateral etching of the sacrificial layers 322 are left. After the trimming process, the remaining portions of the deposited inner spacer material are denoted as inner spacers 370, for the sake of simplicity. The inner spacers 370 serve to isolate metal gates from source/drain regions formed in subsequent processing. In the example of FIG. 8, sidewalls of the inner spacers 370 are aligned with sidewalls of the channel layers 324.

Figure 9:
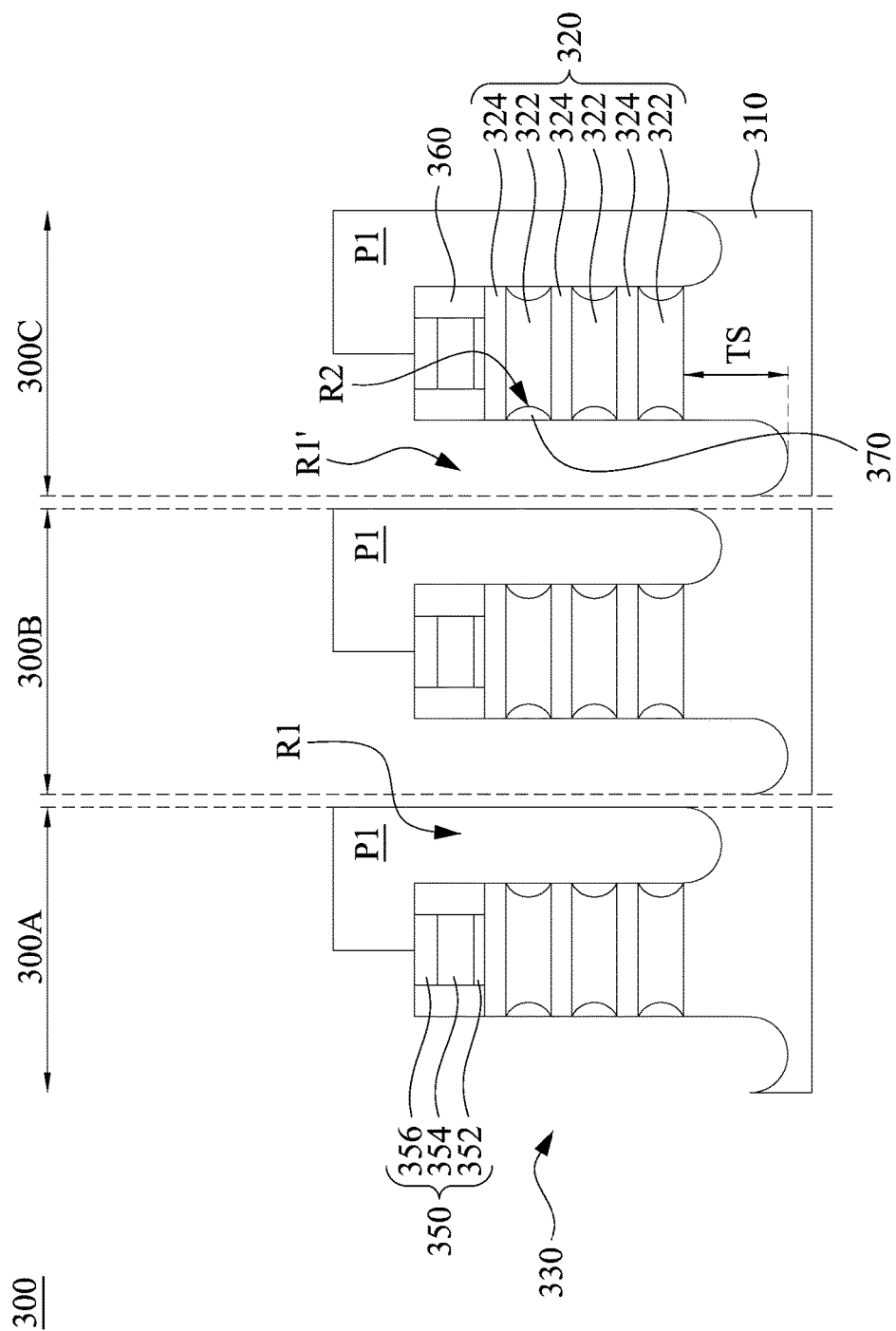

Referring to FIG. 9, some of the recesses R1 of the fins 330 (referring to FIG. 8) are further deepened. A patterned mask P1 is first formed to cover some regions of the fins 330 but not cover other regions of the fins 330, and then the covered regions of the fins 330 are recessed by suitable etching process, resulting in the deep recesses R1' in the semiconductor fins 330.

The patterned mask P1 may be a hard mask for protecting underlying portions of the substrate 310 against the recessing etching process. Material for the hard mask may include silicon oxide, silicon oxynitride, silicon nitride, or the like. The patterned mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In some embodiments, the patterned mask P1 may be a photoresist mask formed by suitable photolithography process.

Once the patterned mask P1 is formed, the recesses R1' can be formed using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

The recesses R1' has a depth TS from a top surface of the substrate 310, and the depth TS is deep enough to allow a formation of backside contact vias, as will be discussed in greater detail below. By way of example, the depth TS of the source-region recesses R1' is in a range from about 0.1 nm to about 50 nm. If the depth TS of the source-region recesses R1' is excessively small, the backside contact vias formed later may be too short to be connected to a backside MLI structure. If the depth TS of the source-region recesses R1' is excessively large, the quality of the deposition of conductive material in the formation of backside contact vias may be reduced. However, other ranges of the depth T3 of the source-region recesses R1' are within the scope of various embodiments of the present disclosure, as long as backside contact vias can be formed. In some embodiments, by the deepening process, the recesses R1' are deeper than the recesses R1. For example, a bottom surface of the recesses R1' may be lower than a bottom surface of the recesses R1. In some embodiments, after the deepening process, the bottom surface of the recesses R1' may be lower than a bottom surface of the STI features 340 (referring to FIG. 6A), such that the backside contact vias formed later may be connected to a backside MLI structure.

Figure 10:
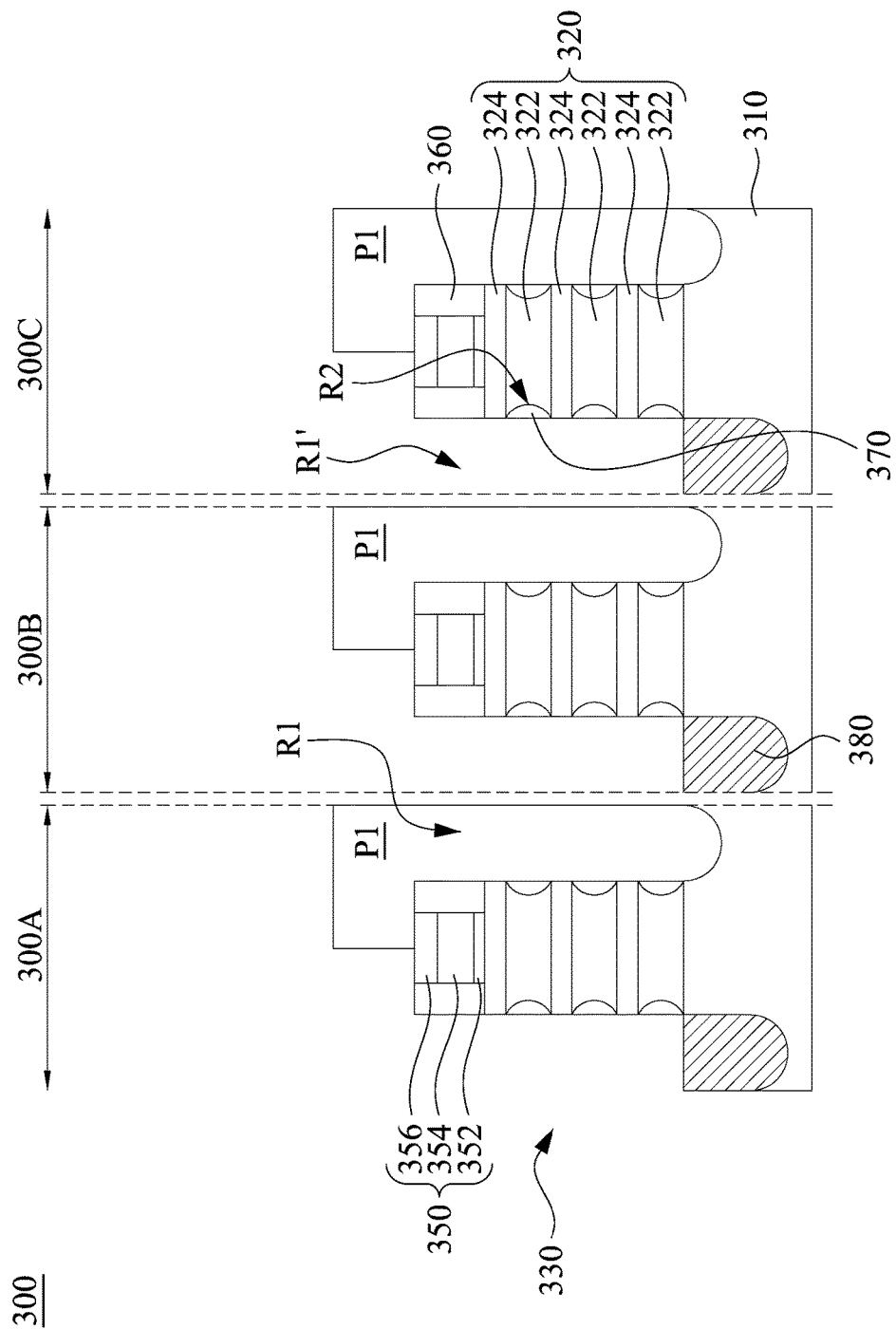

Referring to FIG. 10, backside contact vias 380 are formed in the respective recesses R1'. In some embodiments, with the patterned mask P1 in place, a deposition process is performed to deposit a metal material in the recesses R1' until the metal material builds up the backside contact vias 380. After the deposition of the metal material, an etching process may be performed to remove undesired portions of metal materials (e.g., portions of the metal materials over sidewalls of the inner spacers 370 and sidewalls of the channel layers 324), thereby forming the backside contact vias 380. After the formation of the backside contact vias 380, the patterned mask P1 and a portion of the of metal materials thereon may be removed by suitable stripping/etching process. In some embodiments, the metal material may be selectively deposited over the bottom of the recess R1' such that little metal material is deposited on sidewalls of the inner spacers 370 and sidewalls of the channel layers 324. In the context, the backside contact vias 380 may also be referred to as conductive features.

Figure 11:
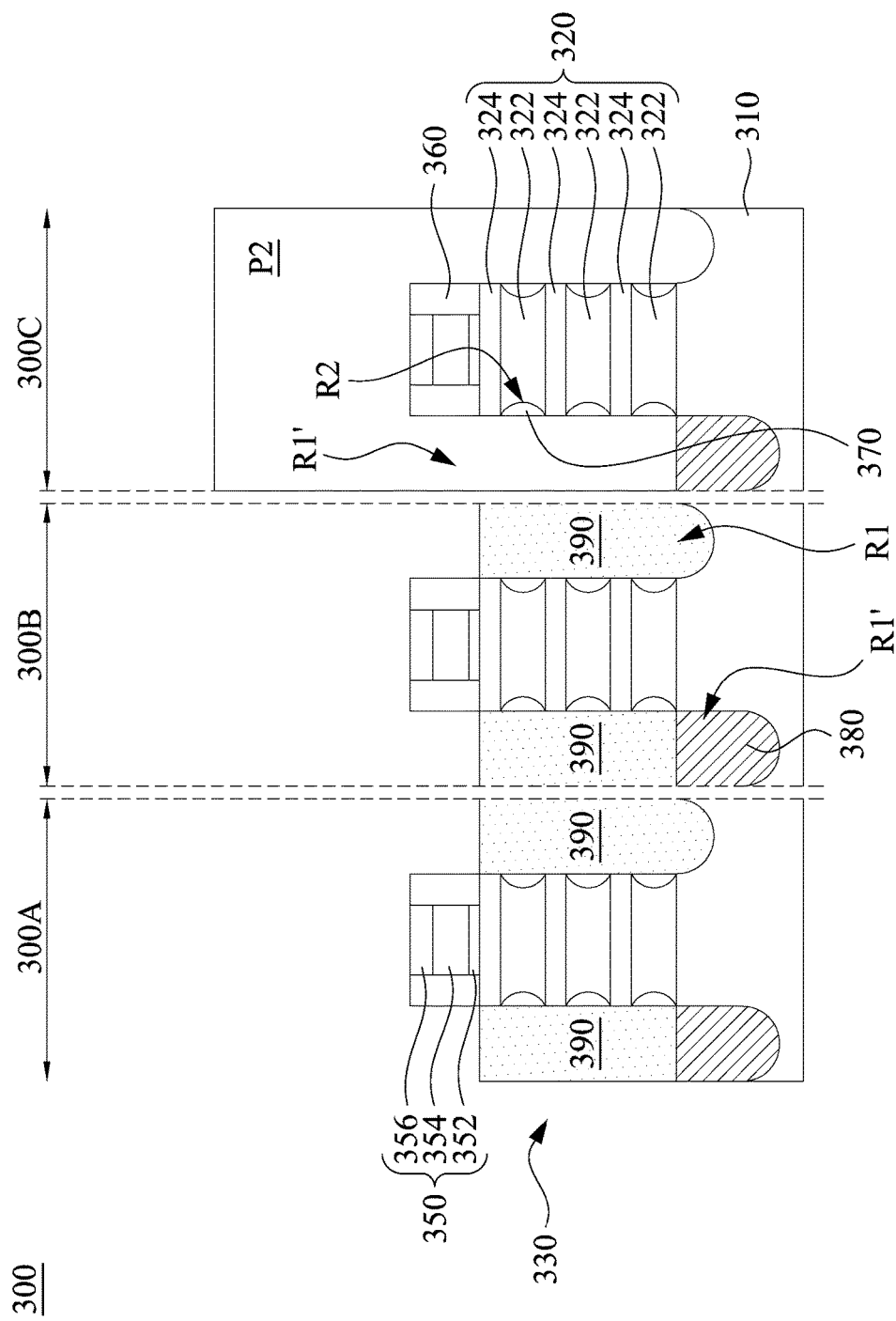

Referring to FIG. 11, first doped epitaxial features 390 are formed over the backside contact vias 380 and in the recesses R1 and R1' in the regions 300A and 300B, not in the recesses R1 and R1' in the region 300C. A patterned mask P2 is first formed to cover the region 300C but not cover the regions 300A and 300B, and then first doped epitaxial features 390 are formed in the regions 300A and 300B.

The patterned mask P2 may be a hard mask for protecting underlying structure against the subsequent epitaxially depositing and etching processes. Material for the hard mask may include silicon oxide, silicon oxynitride, silicon nitride, or the like. The patterned mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In some embodiments, the patterned mask P2 may be a photoresist mask formed by suitable photolithography process.

In some embodiments, the first doped epitaxial features 390 may include Ge, Si, GaAs, AlGaAs, SiGe, GaAsP, SiP, or other suitable material. The first doped epitaxial features 390 may be in-situ doped during the epitaxial process by introducing doping species including: p-type dopants, such as boron or $BF_2$; n-type dopants, such as phosphorus or arsenic; and/or other suitable dopants including combinations thereof. If the first doped epitaxial features 390 are not in-situ doped, an implantation process (i.e., a junction implant process) is performed to dope the first doped epitaxial features 390.

The first doped epitaxial features 390 may be formed by performing an epitaxial growth process that provides an epitaxial material on the backside contact vias 380 and the fins 330. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 330 and the channel layers 324.

Figure 12:
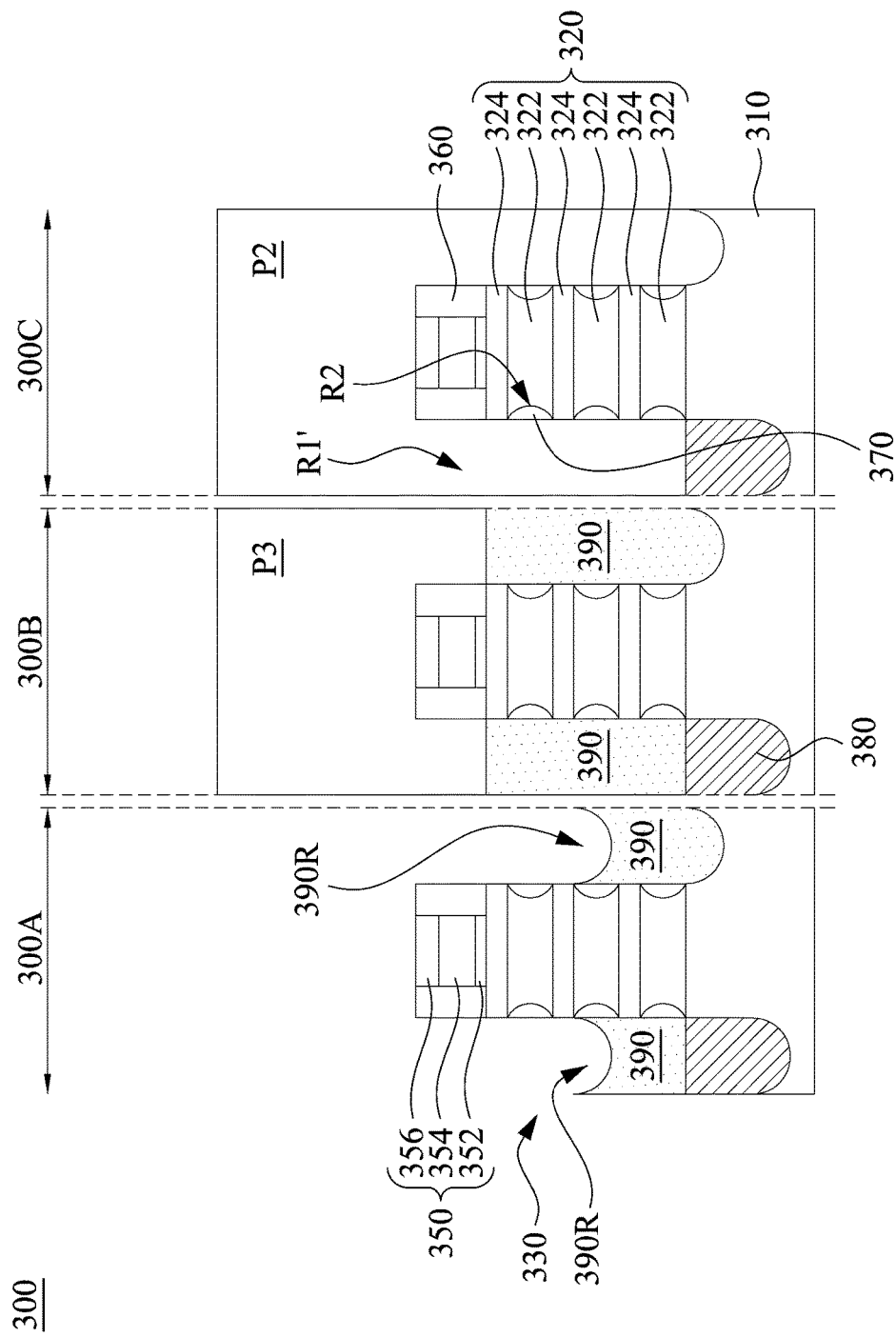

Referring to FIG. 12, the first doped epitaxial features 390 in the region 300A is recessed by suitable etching process. For example, a patterned mask P3 is first formed to cover the regions 300B, but not cover the region 300A. The patterned mask P3 may be a hard mask for protecting underlying structure against the subsequent etching and epitaxially depositing processes. Material for the hard mask may include silicon oxide, silicon oxynitride, silicon nitride, or the like. The patterned mask P3 may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In some embodiments, the patterned mask P3 may be a photoresist mask formed by suitable photolithography process. After the formation of the patterned mask P3, the first doped epitaxial features 390 in the region 300A uncovered by the patterned masks P2 and P3 are etched by the etching process. After the etching process, the first doped epitaxial features 390 in the region 300A may have a recess 390R. In some other embodiments, the step of recessing the first doped epitaxial features 390 in the region 300A may be omitted. In some embodiments, the patterned masks P2 and P3 are respectively formed by different photolithography processes. In some other embodiments, the patterned mask P2 in FIG. 11 may be removed first, and then a mask layer (e.g., a photoresist or a hard mask layer) is formed and patterned by a photolithography process to form the patterned masks P2 and P3 in FIG. 12.

Figure 13:
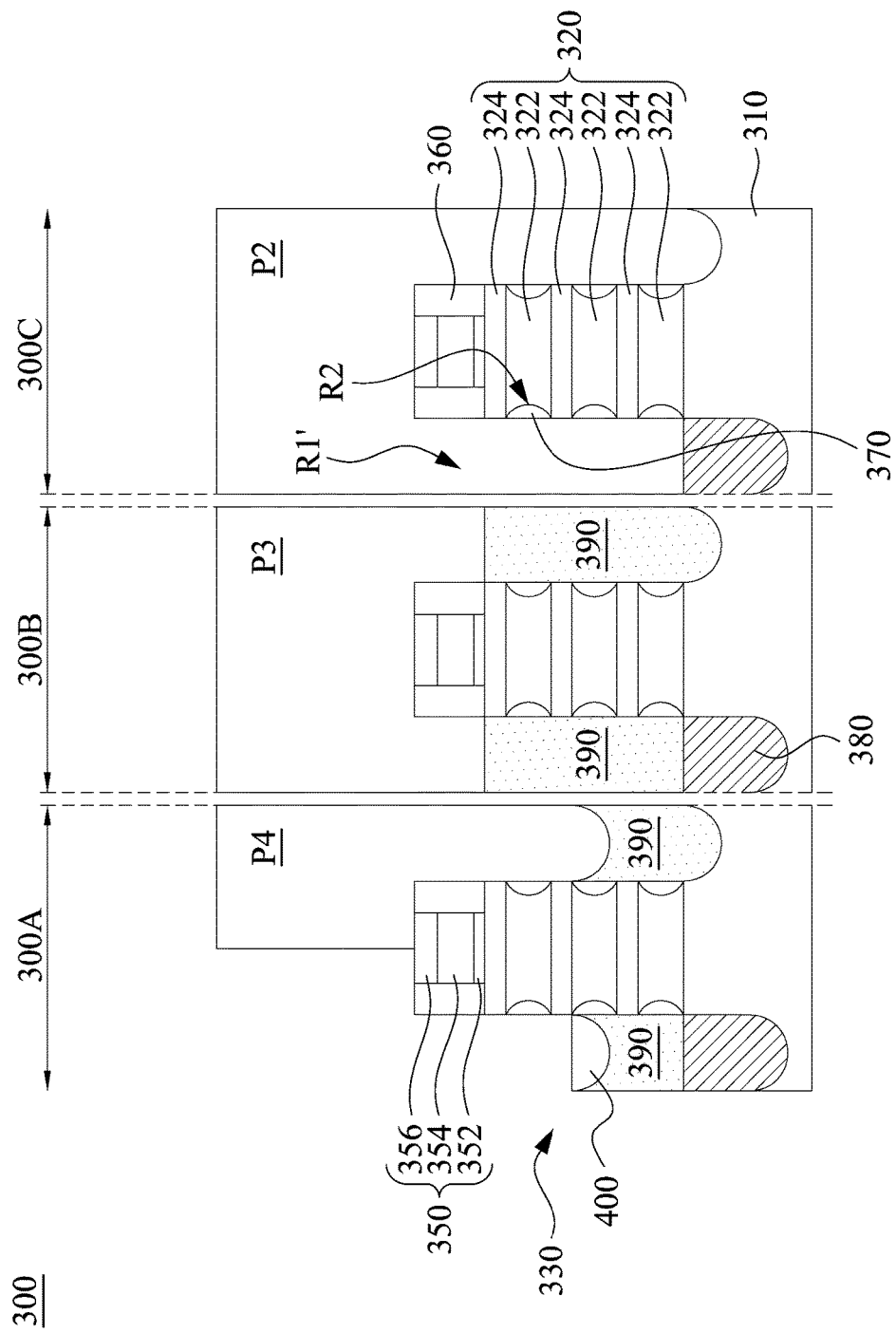

Referring to FIG. 13, an intrinsic epitaxial feature 400 is formed over the first doped epitaxial features 390 in the region 300A. A patterned mask P4 is first formed to cover one first doped epitaxial feature 390 in the region 300A, but not cover another first doped epitaxial feature 390 over the backside contact vias 380 in the region 300A. The patterned mask P4 may be a hard mask for protecting underlying structure against the subsequent epitaxially depositing and etching processes. Material for the hard mask may include silicon oxide, silicon oxynitride, silicon nitride, or the like. The patterned mask may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). In some embodiments, the patterned mask P4 may be a photoresist mask formed by suitable photolithography process.

After the formation of the patterned mask P4, an epitaxial growth process is performed to provides an epitaxial material on the first doped epitaxial feature 390 uncovered by the patterned masks P2-P4, thereby forming the intrinsic epitaxial features 400 in the recess 390R in the first doped epitaxial feature 390. In some embodiments, the intrinsic epitaxial features 400 may include Ge, Si, GaAs, AlGaAs, SiGe, GaAsP, SiP, or other suitable material. The intrinsic epitaxial features 400 may is not intentionally doped during the epitaxial process, and thus free from the dopants in the first doped epitaxial feature 390. Alternatively, the intrinsic epitaxial features 400 may be doped with a p-type or an n-type, and with a doping concentration lower than that of the first doped epitaxial feature 390. For example, the intrinsic epitaxial feature 400 have dopant concentration lower than about $10^{13}/cm^3$.

Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the first doped epitaxial feature 390 and the channel layers 324.

In some embodiments, the patterned masks P2-P4 are respectively formed by different photolithography processes. In some other embodiments, the patterned masks P2 and P3 in FIG. 12 may be removed first, and then a mask layer (e.g., a photoresist or a hard mask layer) is formed and patterned by a photolithography process to form the patterned masks P2-P4 in FIG. 13. After the formation of the intrinsic epitaxial feature 400, the patterned masks P2 and P4 can be removed by suitable photolithography patterning and etching processes, while the patterned mask P3 remains covering the region 300B.

Figure 14:
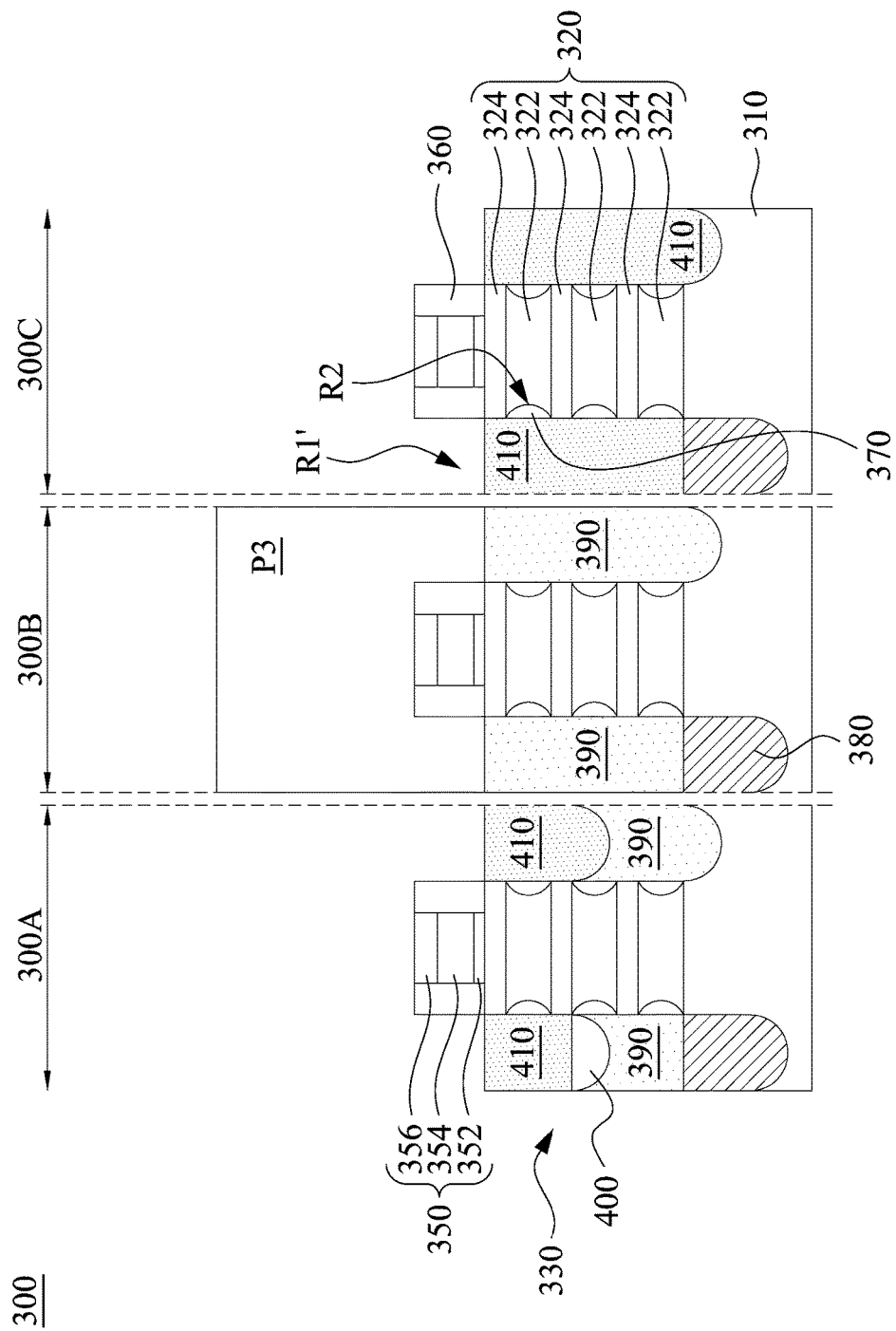

Referring to FIG. 14, second doped epitaxial features 410 are formed over the intrinsic epitaxial feature 400 in region 300A and in the recesses R3 in the regions 300A and 300C, not in the region 300B. In some embodiments, the second doped epitaxial features 410 may include Ge, Si, GaAs, AlGaAs, SiGe, GaAsP, SiP, or other suitable material. The second doped epitaxial features 410 may be in-situ doped during the epitaxial process by introducing doping species including: p-type dopants, such as boron or $BF_2$; n-type dopants, such as phosphorus or arsenic; and/or other suitable dopants including combinations thereof. If the second doped epitaxial features 410 are not in-situ doped, an implantation process (i.e., a junction implant process) is performed to dope the second doped epitaxial features 410.

The second doped epitaxial features 410 may be formed by performing an epitaxial growth process that provides an epitaxial material on the epitaxial features 400 and 390 in the region 300A, and the backside contact vias 380 and the substrate 310 in the region 300C. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 330, the channel layers 324, and the intrinsic epitaxial feature 400.

The first and second doped epitaxial features 390 and 410 are of opposite conductive types. For example, in the present embodiments, the first doped epitaxial features 390 are p-type conductive, and the second doped epitaxial features 410 are n-type conductive, which results in the functional PFET device in the region 300B, and the functional NFET device in the region 300C. In some alternatively embodiments, the first doped epitaxial features 390 are n-type conductive, and the second doped epitaxial features 410 are p-type conductive, which will result in the NFET device in the region 300B, and the PFET device in the region 300C. After the formation of the second doped epitaxial features 410, the patterned mask P3 can be removed by suitable stripping/etching process.

Once the epitaxial features 390 and 410 are formed, an annealing process can be performed to activate the p-type dopants or n-type dopants in the epitaxial features 390 and 410. The annealing process may be, for example, a rapid thermal anneal (RTA), a laser anneal, a millisecond thermal annealing (MSA) process, or the like.

Figure 15:
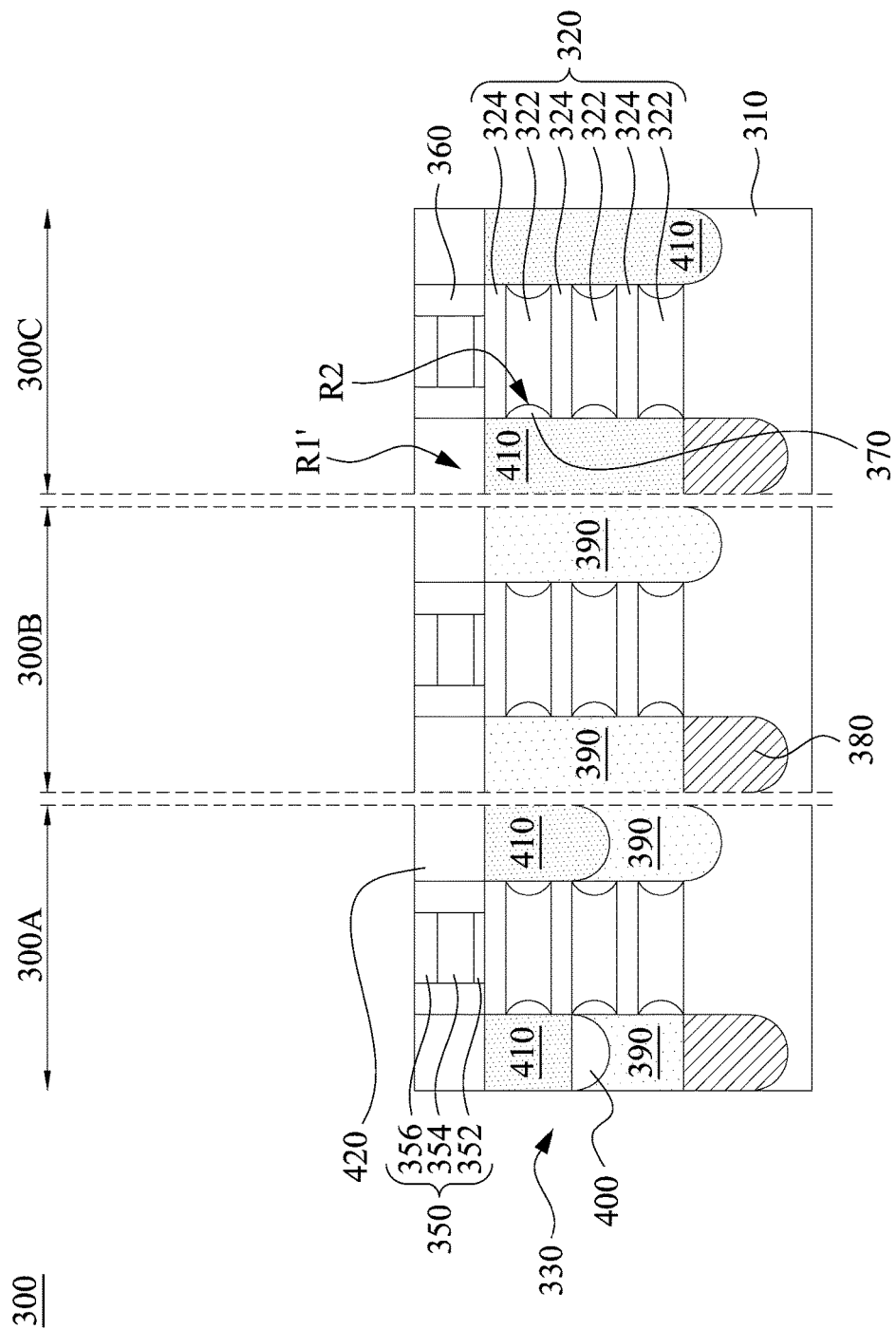

Referring to FIG. 15, a front-side ILD layer 420 is formed on the substrate 310. The ILD layer 420 is referred to a "front-side" ILD layer in this context because it is formed on a front-side of the multi-gate transistors (i.e., a side of the multi-gate transistors that gates protrude from the substrate 310). In some embodiments, the front-side ILD layer 420 includes materials such as tetraethylorthosilicate (TEOS) oxide, undoped silicate glass, or doped silicon oxide such as borophosphosilicate glass (BPSG), fused silica glass (FSG), phosphosilicate glass (PSG), boron doped silicon glass (BSG). The front-side ILD layer 420 may be deposited by a PECVD process or other suitable deposition technique. In some embodiments, a contact etch stop layer (CESL) is also formed prior to forming the ILD layer 420. In some examples, the CESL includes a silicon nitride layer, silicon oxide layer, a silicon oxynitride layer, and/or other suitable materials having a different etch selectivity than the front-side ILD layer 420. In some embodiments, after formation of the front-side ILD layer 420, the integrated circuit structure 300 may be subject to a high thermal budget process to anneal the front-side ILD layer 420.

In some examples, after depositing the front-side ILD layer 420, a planarization process may be performed to remove excessive materials of the front-side ILD layer 420. For example, a planarization process includes a chemical mechanical planarization (CMP) process which removes portions of the front-side ILD layer 420 (and CESL layer, if present) overlying the dummy gate structures 350 and planarizes a top surface of the integrated circuit structure 300. In some embodiments, the CMP process also removes hard mask layers 356 (as shown in FIG. 15) and exposes the dummy gate electrode layer 350.

Figure 16:
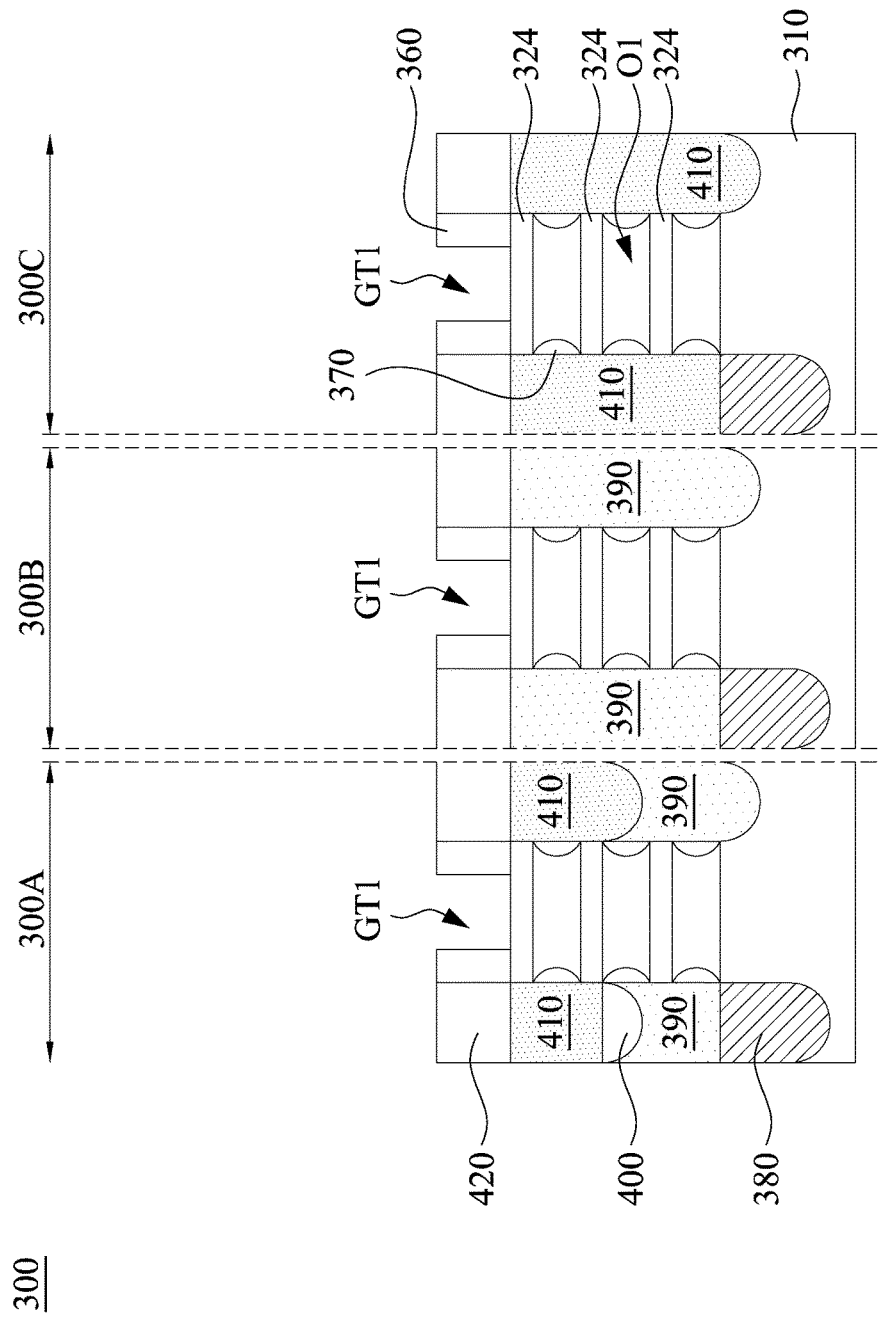

Referring to FIG. 16, dummy gate structures 350 (as shown in FIG. 15) are removed first, and then the sacrificial layers 322 are removed. The resulting structure is illustrated in FIG. 16. In the illustrated embodiments, the removal of the dummy gate structures 350 includes a selective etching process (e.g., selective dry etching, selective wet etching, or a combination thereof) that etches the materials in dummy gate structures 350 at a faster etch rate than it etches other materials (e.g., gate spacers 360, CESL and/or front-side ILD layer 420), thus resulting in gate trenches GT1 between corresponding gate spacers 360, with the sacrificial layers 322 exposed in the gate trenches GT1. Subsequently, the sacrificial layers 322 in the gate trenches GT1 are removed by using another selective etching process that etches the sacrificial layers 322 at a faster etch rate than it etches the channel layers 324, thus forming openings O1 between neighboring channel layers 324. In this way, the channel layers 324 become nanosheets suspended over the substrate 110 and between the epitaxial features 390 and/or 410. This step is also called a channel release process. At this interim processing step, the openings O1 between nanosheets 324 may be filled with ambient environment conditions (e.g., air, nitrogen, etc). In some embodiments, the nanosheets 324 can be interchangeably referred to as nanowires, nanoslabs and nanorings, depending on their geometry. For example, in some other embodiments the channel layers 324 may be trimmed to have a substantial rounded shape (i.e., cylindrical) due to the selective etching process for completely removing the sacrificial layers 322. In that case, the resultant channel layers 324 can be called nanowires.

In some embodiments, the sacrificial layers 322 are removed by using a selective wet etching process. In some embodiments, the sacrificial layers 322 are SiGe and the channel layers 324 are silicon allowing for the selective removal of the sacrificial layers 322. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower than oxidation rate of SiGe, the channel layers 324 may not be significantly etched by the channel release process. It can be noted that both the channel release step and the previous step of laterally recessing sacrificial layers use a selective etching process that etches SiGe at a faster etch rate than etching Si, and therefore these two steps may use the same etchant chemistry in some embodiments. In this case, the etching time/ duration of channel release step is longer than the etching time/duration of the previous step of laterally recessing sacrificial layers, so as to completely remove the sacrificial SiGe layers.

Figure 17A:
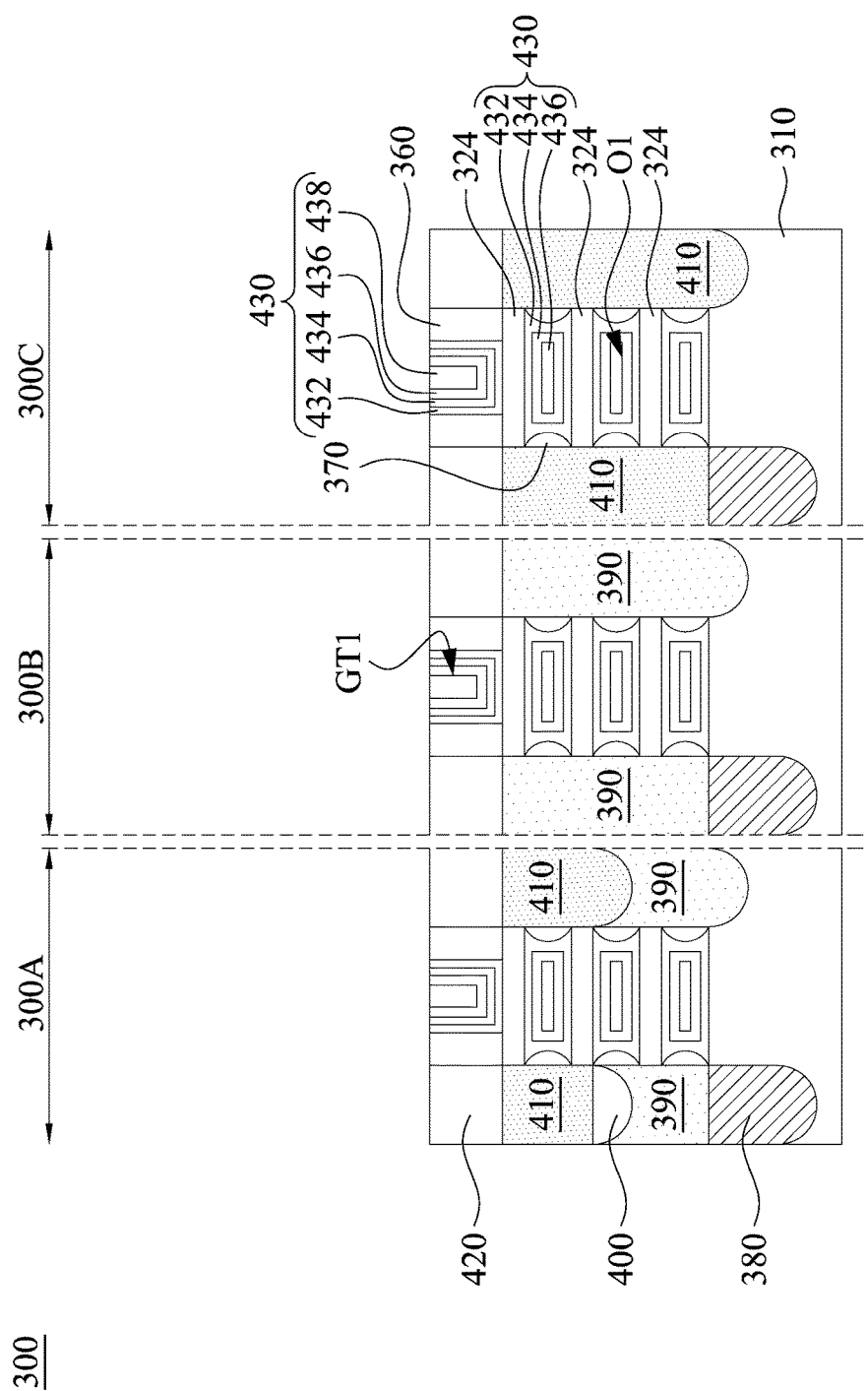
Figure 17B:
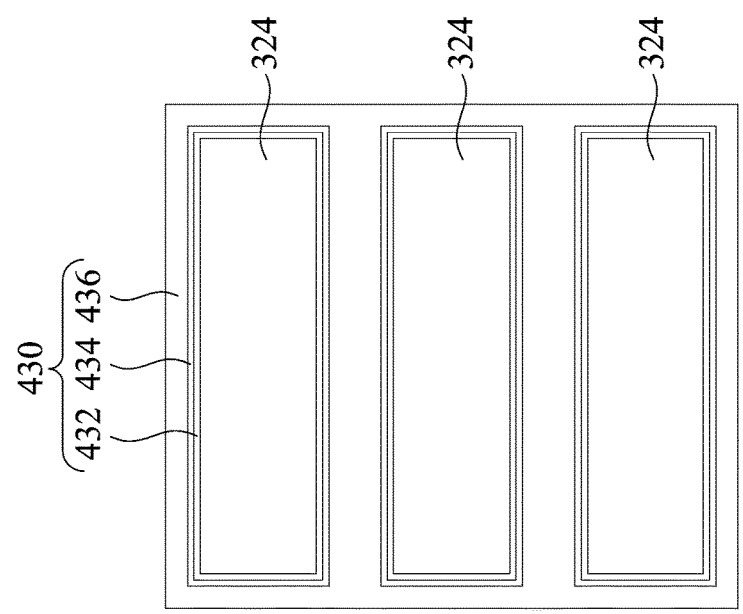

Referring to FIG. 17A, replacement gate structures 430 are respectively formed in the gate trenches GT1 to surround each of the nanosheets 324 suspended in the gate trenches GT1. The gate structure 430 may be the final gate of a GAA FET. The final gate structure may be a high-k/metal gate stack, however other compositions are possible. In some embodiments, each of the gate structures 430 forms the gate associated with the multi-channels provided by the plurality of nanosheets 324. For example, high-k/metal gate structures 430 are formed within the openings O1 (as illustrated in FIG. 16) provided by the release of nanosheets 324. In various embodiments, the high-k/metal gate structure 430 includes an interfacial layer 432 formed around the nanosheets 324, a high-k dielectric layer 434 formed around the interfacial layer 432, a work function metal layer 436 formed around the high-k dielectric layer 434, and a fill metal 438 formed around the work function metal layer 326 and filling a remainder of gate trenches GT1. The interfacial layer 432 may be a silicon oxide layer. High-k gate dielectrics, as used and described herein, include dielectric materials having a high dielectric constant, for example, greater than that of thermal silicon oxide (~3.9). The work function metal layer 436 and/or fill metal 438 used within high-k/metal gate structures 430 may include a metal, metal alloy, or metal silicide. Formation of the high-k/metal gate structures 430 may include depositions to form various gate materials, one or more liner layers, and one or more CMP processes to remove excessive gate materials. As illustrated in a cross-sectional view of FIG. 17B that is taken along a longitudinal axis of a high-k/metal gate structure 430, the high-k/metal gate structure 430 surrounds each of the nanosheets 324, and thus is referred to as a gate of a GAA FET.

In some embodiments, the interfacial layer 432 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer 434 may include hafnium oxide ($HfO_2$). Alternatively, the high-k dielectric layer 434 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 436 may include work function metals to provide a suitable work function for the high-k/metal gate structures 430. For an n-type GAA FET, the work function metal layer 436 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the work function metal layer 436 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 438 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 18:
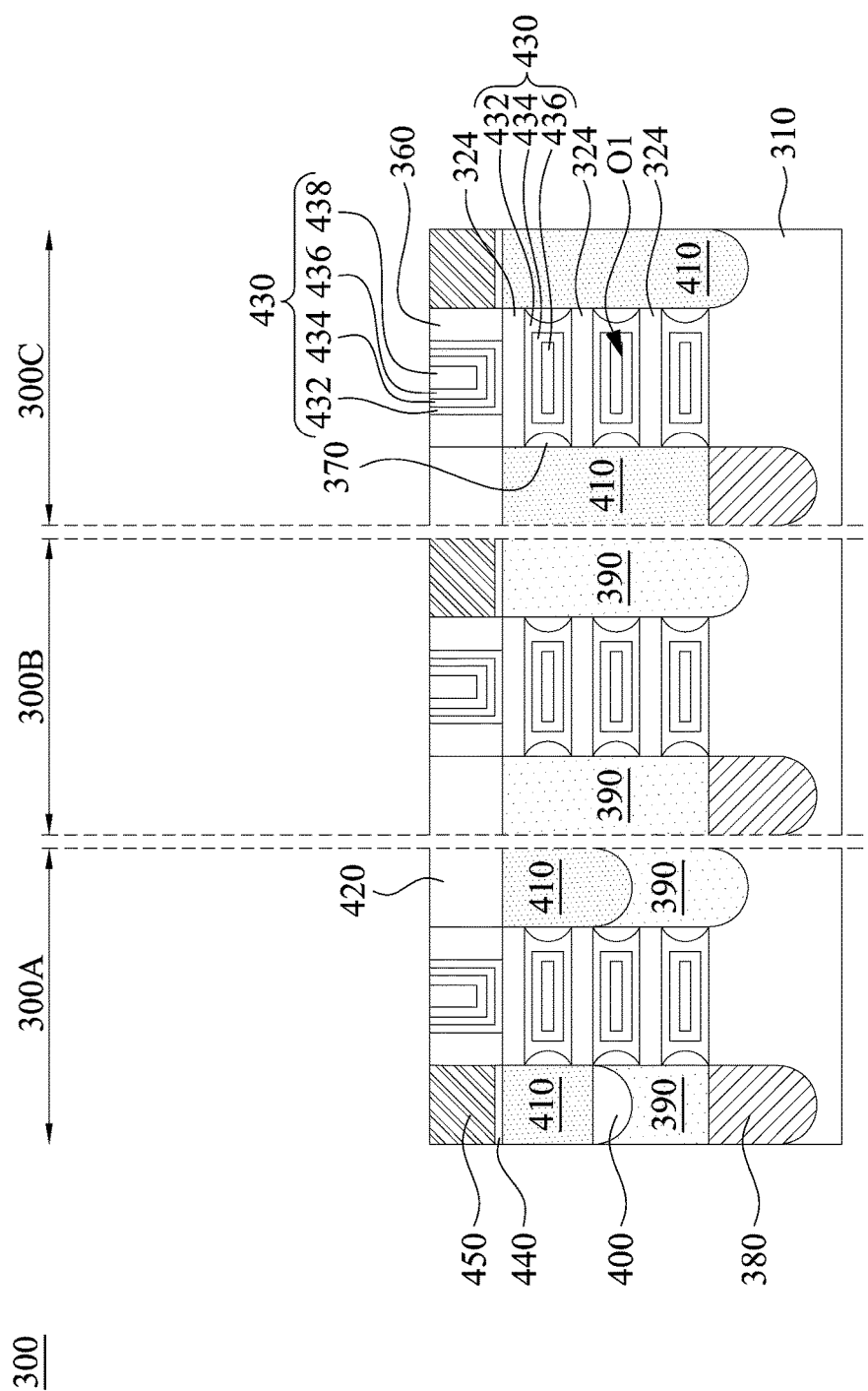

Referring the FIG. 18, contacts 450 are formed over the epitaxial features 390 and 410. In some embodiments, contact openings are first formed through the front-side ILD layer 420 to expose the epitaxial features 390 and 410 by using suitable photolithography and etching techniques. Subsequently, silicide regions 440 are formed on the front side of the epitaxial features 390 and 410 by using a silicidation process, followed by forming contacts 450 over the silicide regions 440. Silicidation may be formed by depositing a metal layer (e.g., nickel layer or cobalt layer) over the exposed epitaxial features 390 and 410, annealing the metal layer such that the metal layer reacts with silicon (and germanium if present) in the epitaxial features 390 and 410 to form the metal silicide region 440 (e.g., nickel silicide or cobalt silicide), and thereafter removing the non-reacted metal layer. Contact 450 may be formed by depositing one or more metal materials (e.g., tungsten, cobalt, copper, the like or combinations thereof) to fill the contact holes by using suitable deposition techniques (e.g., CVD, PVD, ALD, the like or combinations thereof), followed by a CMP process to remove excess metal materials outside the contact openings.

Figure 19:
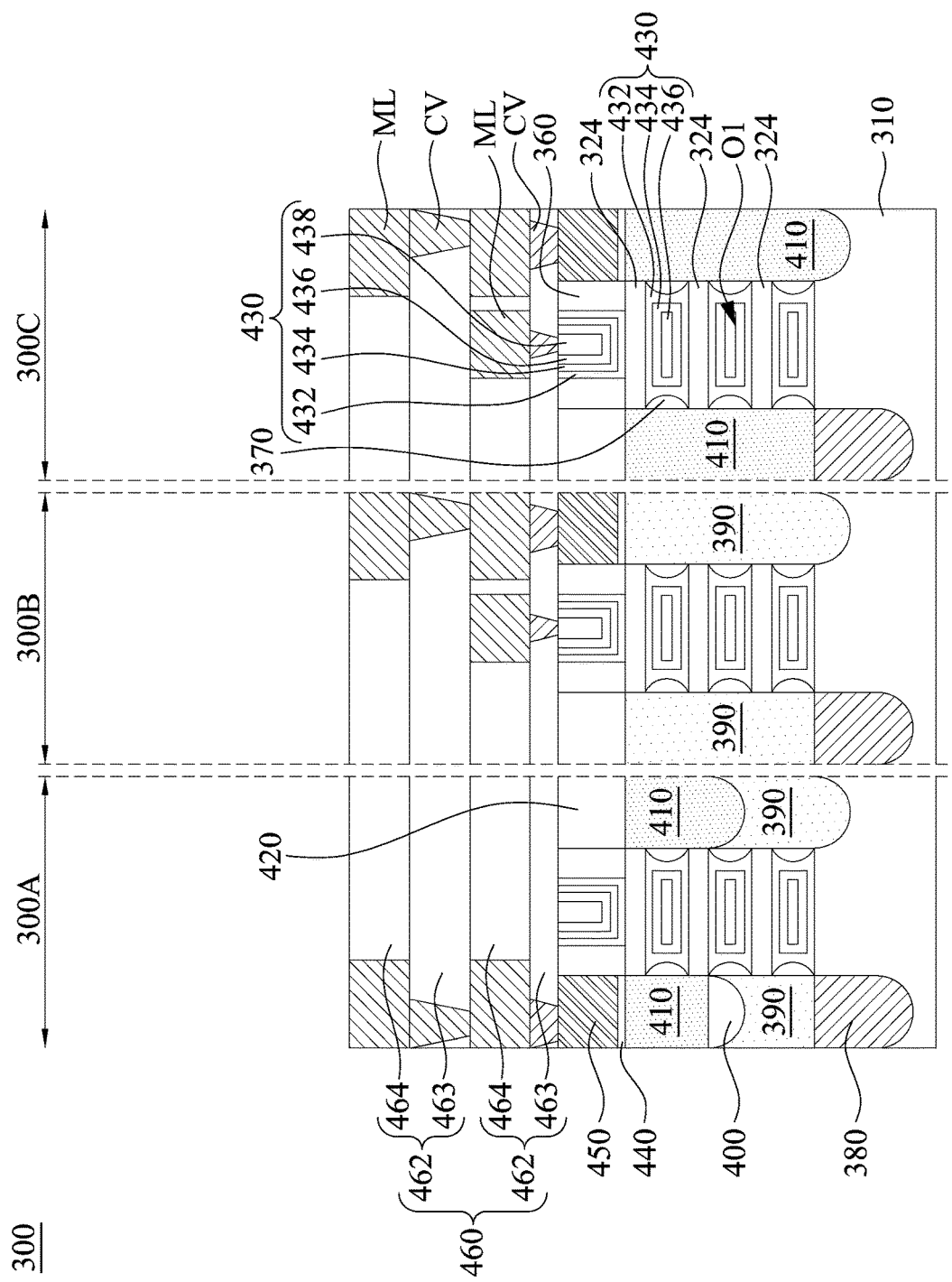

Referring the FIG. 19, a front-side multilayer interconnection (MLI) structure 460 is formed over the substrate 110. The front-side MLI structure 460 may have include a plurality of front-side metallization layers 462. The number of front-side metallization layers 462 may vary according to design specifications of the integrated circuit. Only two front-side metallization layers 462 are illustrated in FIG. 19 for the sake of simplicity. The front-side metallization layers 462 each comprise a first front-side inter-metal dielectric (IMD) layer 463 and a second front-side IMD layer 464. The second front-side IMD layers 464 are formed over the corresponding first front-side IMD layers 463. The front-side metallization layers 462 comprise one or more horizontal interconnects, such as front-side metal lines ML, respectively extending horizontally or laterally in the second front-side IMD layers 464 and vertical interconnects, such as front-side conductive vias CV, respectively extending vertically in the first front-side IMD layers 463. In some embodiments, the front-side conductive vias CV in the bottommost front-side metallization layer 462 are respectively in contact with the contact 450 to make electrical connection to the epitaxial features 390 and 410.

The front-side metal lines ML and front-side metal vias CV can be formed using, for example, a single damascene process, a dual damascene process, the like, or combinations thereof. In some embodiments, the front-side IMD layers 463-464 may include low-k dielectric materials having k values, for example, lower than about 4.0 or even 2.0 disposed between such conductive features. In some embodiments, the front-side IMD layers may be made of, for example, phosphosilicate glass (PSG), borophosphosilicate glass (BPSG), fluorosilicate glass (FSG), $SiO_xC_y$, Spin-On- Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias ML and CV may comprise metal materials such as copper, aluminum, tungsten, combinations thereof, or the like. In some embodiments, the front-side metal lines and vias ML and CV may further comprise one or more barrier/adhesion layers (not shown) to protect the respective front-side IMD layers 463-464 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like. In some embodiments, the front-side metal lines ML and front-side metal vias CV in combination may be referred to as a front-side metallization pattern. In the context, the contact 450, the metal lines ML, and metal vias CV may also be referred to as conductive features.

Figure 20:
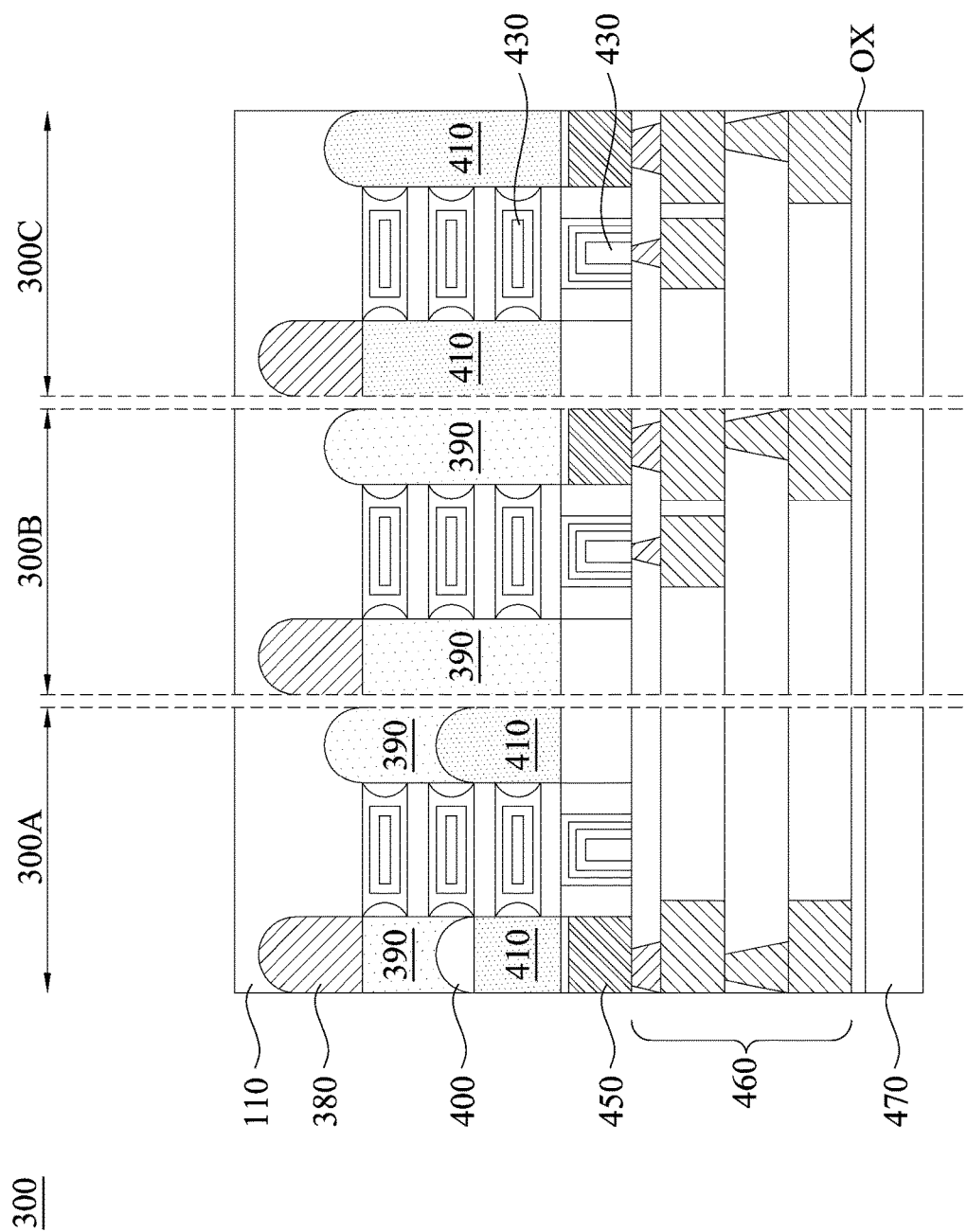

Referring to FIG. 20, a carrier substrate 470 is bonded to the front-side MLI structure 460 in accordance with some embodiments of the present disclosure. The carrier substrate 470 may be silicon, doped or undoped, or may include other semiconductor materials, such as germanium; a compound semiconductor; or combinations thereof. The carrier substrate 470 may provide a structural support during subsequent processing on backside of the integrated circuit structure 300 and may remain in the final product in some embodiments. In some other embodiments, the carrier substrate 470 may be removed after the subsequent processing on backside of integrated circuit structure 300 is complete. In some embodiments, a cap dielectric layer OX may be formed over the MLI structure 460, and then the carrier substrate 470 is bonded to the cap dielectric layer OX, for example, fusion bonding. The cap dielectric layer OX may include suitable oxide materials. Afterwards, the integrated circuit structure 300 is flipped upside down, such that a backside surface of the substrate 110 faces upwards, as illustrated in FIG. 18.

Figure 21:
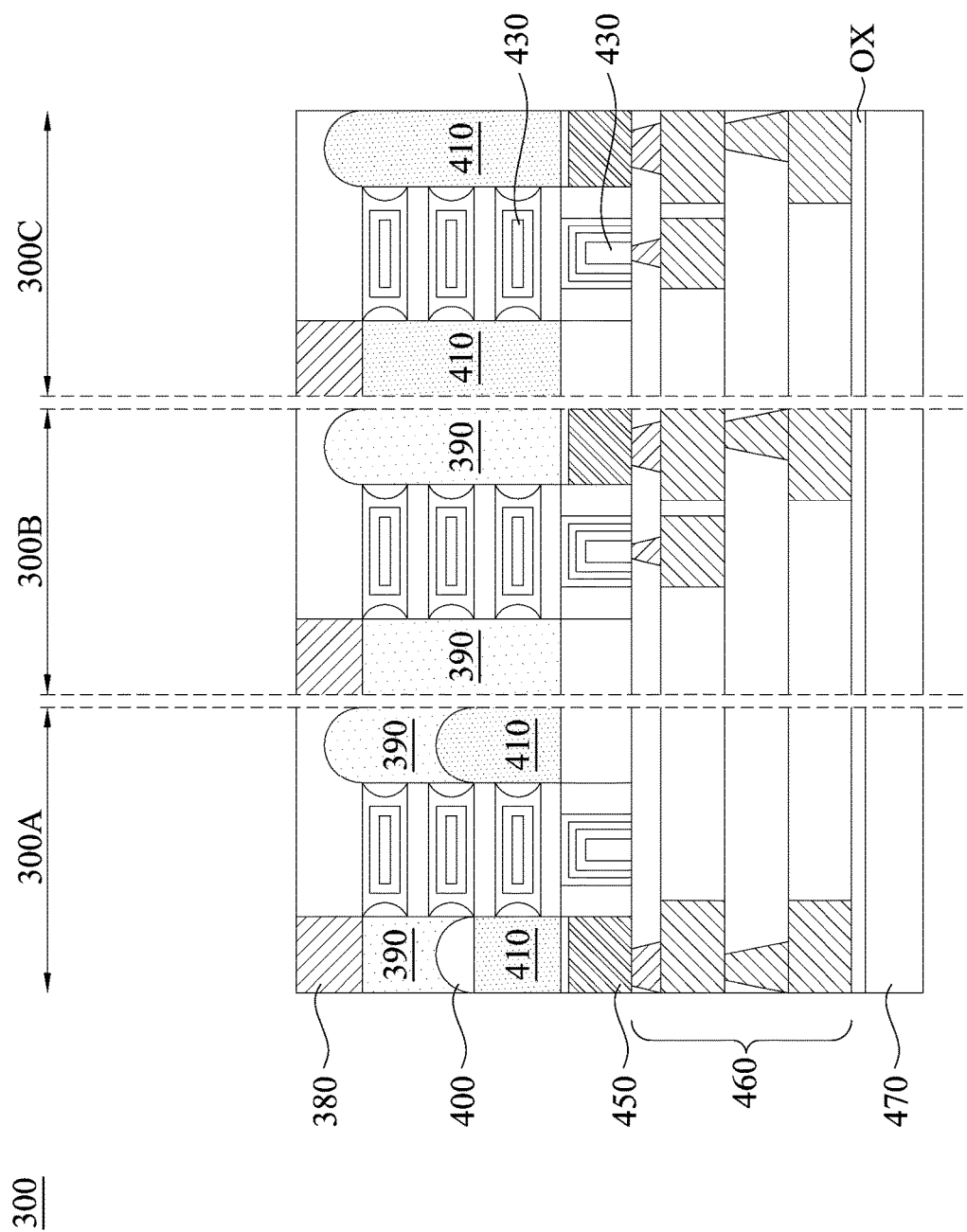

Referring to FIG. 21, the substrate 110 is thinned down to expose the backside contact vias 380. In some embodiments, thinning is accomplished by a CMP process, a grinding process, or the like.

Figure 22:
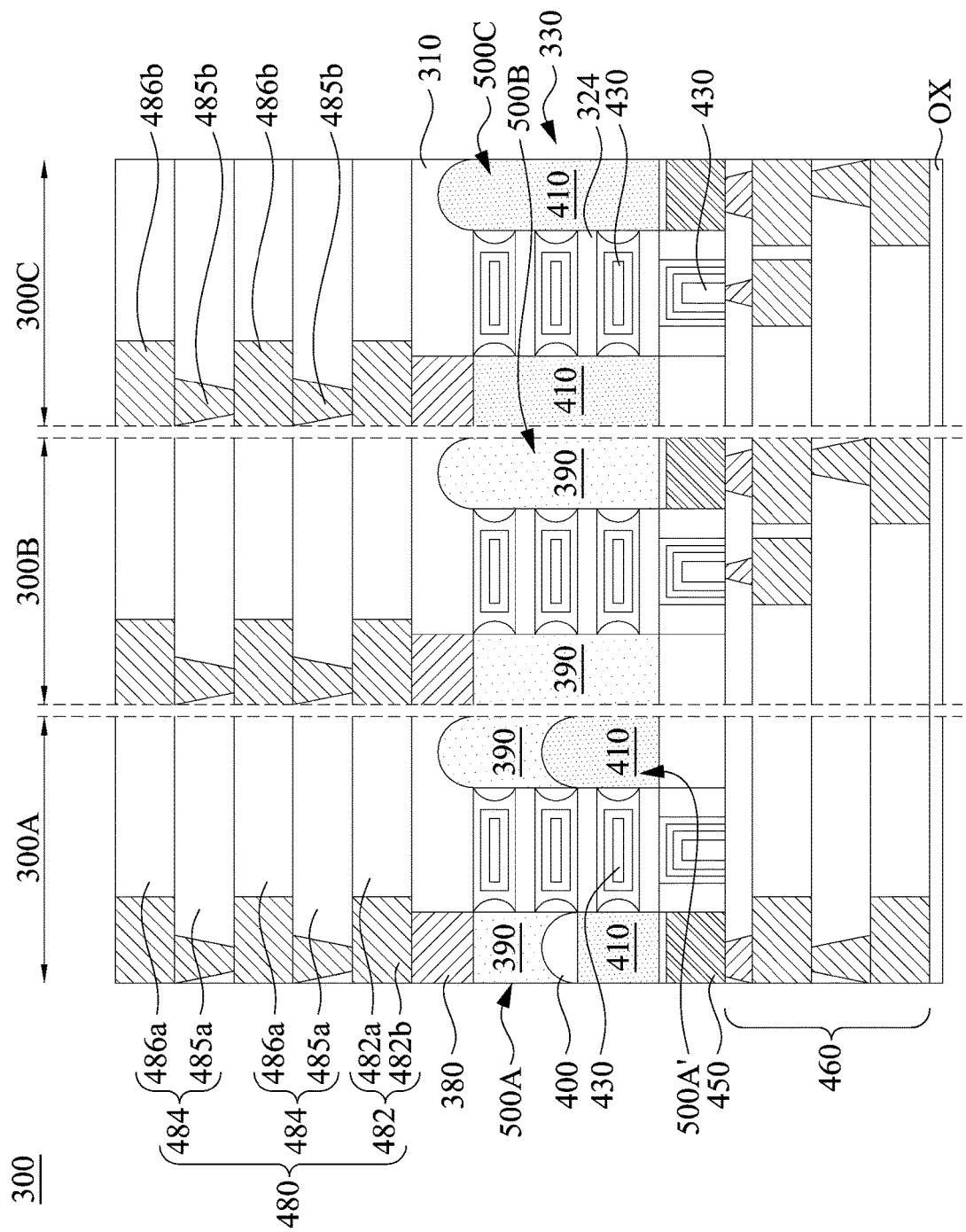

Referring to FIG. 22, a backside MLI structure 480 is formed over the backside contact vias 380 and the backside of the substrate 310. The backside MLI structure 480 may include a bottommost metallization layer 482 and a plurality of upper backside metallization layers 484 over the bottommost backside metallization layer 482. The number of upper backside metallization layers 484 may vary according to design specifications of the integrated circuit structure 300. Only two backside metallization layers 484 (also called backside M1 layer and backside M2 layer) are illustrated in FIG. 22 for the sake of simplicity.

The bottommost backside metallization layer 482 (also called backside M0 layer) comprises a backside IMD layer 482a over the backside of the substrate 310 and one or more horizontal interconnects, such as backside metal lines 482b, respectively extending horizontally or laterally in the backside IMD layer 482a. A metal line 482b in the bottommost backside metallization layer 482 is a power rail that extends across and is in contact with one or more backside contact vias 380, so as to make electrical connection to one or more source epitaxial features 390 and 410. Because the power rail is formed in the backside MLI structure 480, more routing space can be provided for the integrated circuit structure 300.

The backside metallization layers (e.g., backside M1 layer and M2 layer) 484 each comprise a first backside inter-metal dielectric (IMD) layer 485a and a second backside IMD layer 486a. The second backside IMD layers 486a are formed over the corresponding first backside IMD layers 485a. The backside metallization layers 484 comprise one or more horizontal interconnects, such as backside metal lines 486b, respectively extending horizontally or laterally in the second backside IMD layers 486a and vertical interconnects, such as backside vias 485b, respectively extending vertically in the first backside IMD layers 485a. In some embodiments, the backside metal line (e.g., the metal lines 482b and 486b) and the backside vias (e.g., the backside vias 485b) in combination may be referred to as a backside metallization pattern. After the formation of the backside MLI structure 480, the carrier substrate 470 may be removed from the front-side MLI structure 460.

Through these operations, a diode structure 500A, a PFET device 500B, and a NFET device 500C are respectively formed in the regions 300A, 300B, and 300C. The diode structure 500A includes a PIN junction having the epitaxial features 390, 400, 410 vertically stacked in the region 300A. The vertical stack configuration may save the chip area occupied by the diode structures 500A. The epitaxial features 390 and 410 of the diode structure 500A are respectively electrically connected to a metal line 482b in the backside MLI structure 480 and a metal line ML in the front-side MLI structure 460. Sometimes, the metal line 482b in the backside MLI structure 480 and the metal line ML in the front-side MLI structure 460 may be referred to as the anode and the cathode of the diode structure 500A. Since the anode and the cathode of the diode structure 500A are respectively disposed in the back-side MLI structure 480 and the front-side MLI structure 460, the capacitance and resistance between the anode and the cathode of the diode structure 500A may be reduced.

In some embodiments, a gate structure 430 is disposed adjacent to the diode structure 500A for addressing process loading issues. In some embodiments, the gate structure 430 may not be active to control channel regions (e.g., the nanosheets 324) adjacent to the diode structure 500A. For example, the gate structure 430 may not be electrically connected to the front-side MLI structure 460. In some embodiments, the gate structure 430 may be floating.

In some alternative embodiments, the gate structure 430 in the region 300A may be connected to metal lines ML in the front-side MLI structure 460 through suitable conductive vias CV. The gate structure 430 may be active to control channel regions (e.g., the nanosheets 324) adjacent to the diode structure 500A. In furtherance of the alternative embodiments, the gate structure 430 in the region 300A can be electrically connected to the source/drain features (e.g., the features 410) in the region 300A through the front-side MLI structure 460 and the contacts 450 in some embodiments. Alternatively, the gate structure 430 in the region 300A can be electrically connected to source/drain features (e.g., the features 370/410) in the regions 300B and 300C.

In the present embodiment, a dummy structure 500A' is formed on a side of the gate structure 430 opposite to the diode structure 500A. In the present embodiments, the dummy structure 500A' includes a PN junction having the epitaxial features 390 and 410 in the region 300A. The epitaxial features 390 and 410 of the dummy structure 500A' are not electrically connected to metal lines 482b in the backside MLI structure 480 and metal lines ML in the front-side MIA structure 460. In some other embodiments, the dummy structure 500A' may include either one of the epitaxial features 390 and 410. The configuration of the dummy structure 500A' may be used for addressing process loading issues. In some alternative embodiments, to fully utilized the area on the wafer, two diode structures 500A may be respectively formed on opposite sides of the gate structure 430 (i.e., source/drain side of the gate structure 430), and the backside contact vias 380 are respective disposed below the two diode structures 500A, in which the dummy structure 500A' in the figure may be omitted.

The PFET device 500B includes the epitaxial features 390 and the gate structure 430 in the region 300B. In the present embodiments, the epitaxial features 390 of the PFET device 500B are respectively electrically connected to a metal line 482b in the backside MLI structure 480 and a metal line ML in the front-side MLI structure 460, thereby saving the routing space. In some alternative embodiments, the epitaxial features 390 of the PFET device 500B may both be electrically connected to metal lines ML in the front-side MLI structure 460, and the backside contact via 380 below the epitaxial features 390 may be omitted. In some alternative embodiments, the epitaxial features 390 of the PFET device 500B may both be electrically connected to metal lines 482b in the backside MLI structure 480, and backside contact vias 380 are respectively disposed below the epitaxial features 390. In the present embodiments, for the active operation of the PFET device 500B, the gate structures 430 of the PFET device 500B may be connected to the front-side MLI structure 460 through suitable conductive vias CV.

The NFET device 500C includes the epitaxial features 410 and the gate structure 430 in the region 300C. In the present embodiments, the epitaxial features 410 of the NFET device 500C are respectively electrically connected to a metal line 482b in the backside MLI structure 480 and a metal line ML in the front-side MLI structure 460, thereby saving the routing space. In some alternative embodiments, the epitaxial features 410 of the NFET device 500C may both be electrically connected to metal lines ML in the front-side MLI structure 460, and the backside contact via 380 below the epitaxial features 410 may be omitted. In some alternative embodiments, the epitaxial features 410 of the NFET device 500C may both be electrically connected to metal lines 482b in the backside MLI structure 480, and backside contact vias 380 are respectively disposed below the epitaxial features 410. In the present embodiments, for the active operation of the NFET device 500C, the gate structures 430 of the NFET device 500C may be connected to the front-side MLI structure 460 through suitable conductive vias CV.

Figure 23:
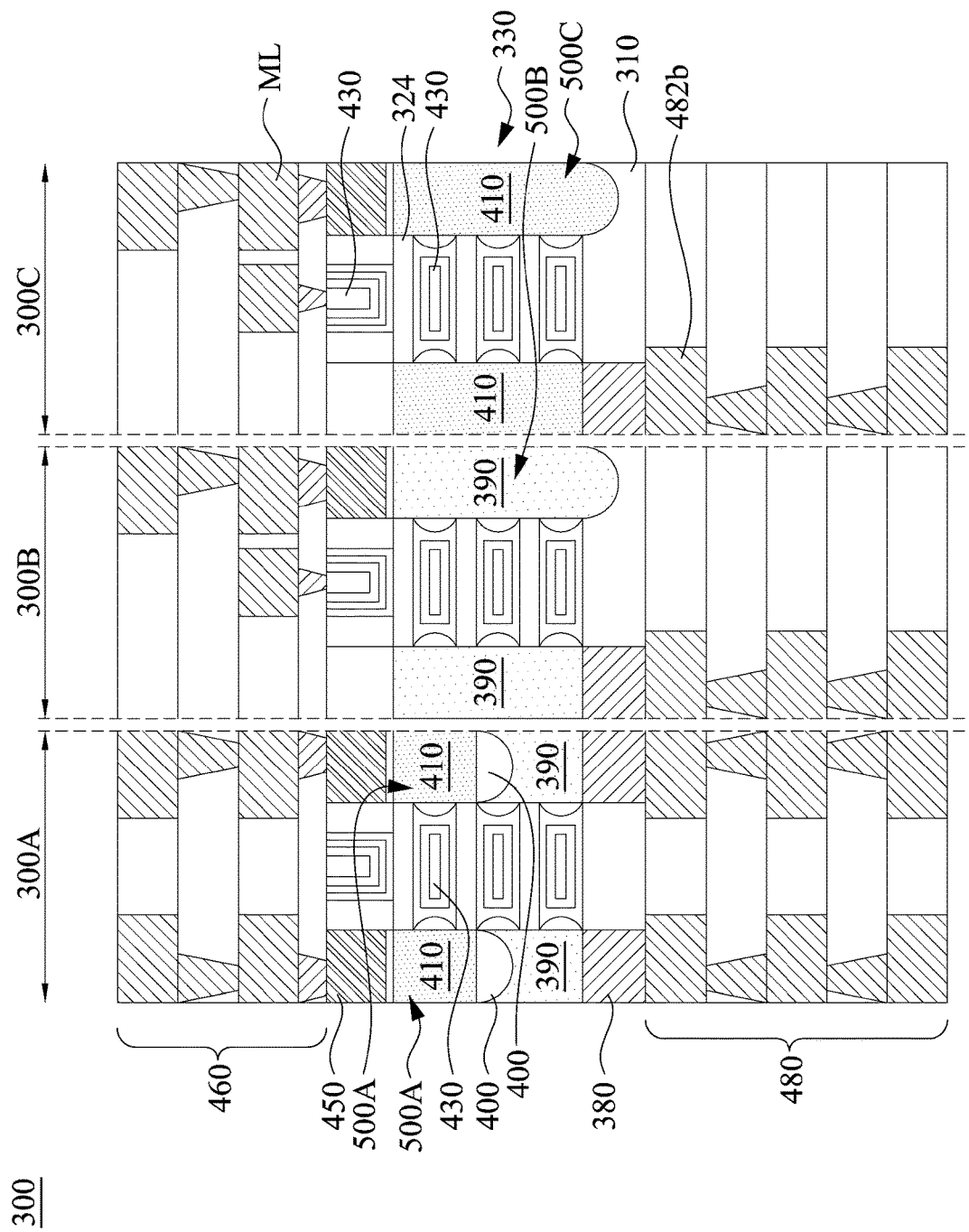
FIG. 23 is a cross-sectional view of an integrated circuit in accordance with some embodiments of the present disclosure.

FIG. 23 is a cross-sectional view of an integrated circuit in accordance with some embodiments of the present disclosure. The same or similar configurations, materials, processes and/or operation as described with FIGS. 3-22 may be employed in the following embodiments, and the detailed explanation may be omitted. One difference between the present embodiments and the embodiments of FIGS. 3-22 is that: plural diode structures 500A are formed on opposite sides of the gate structure 430. Each of the diode structures 500A is connected between a metal line ML in the front-side MLI structure 460 and a metal line 482b in the backside MLI structure 480. Through suitable routing designs, the diode structures 500A may form suitable circuits, such as ESD protection circuit. The configuration may increase the number of the diode structures 500A in a determined area, thereby saving the chip area for forming the ESD protection circuit. The dummy structure 500A' (referring to FIG. 22) may be omitted in some embodiments. In some other embodiments, the structure of FIG. 22 and the structure of FIG. 23 may be formed on different regions of the substrate 310. For example, a dummy structure 500A' (referring to FIG. 22) and a diode structure 500A are formed on opposite side of a first one of the gate structures 430, and two diode structures 500A are respectively formed on opposite side of a second one of the gate structures 430.

Figure 24:
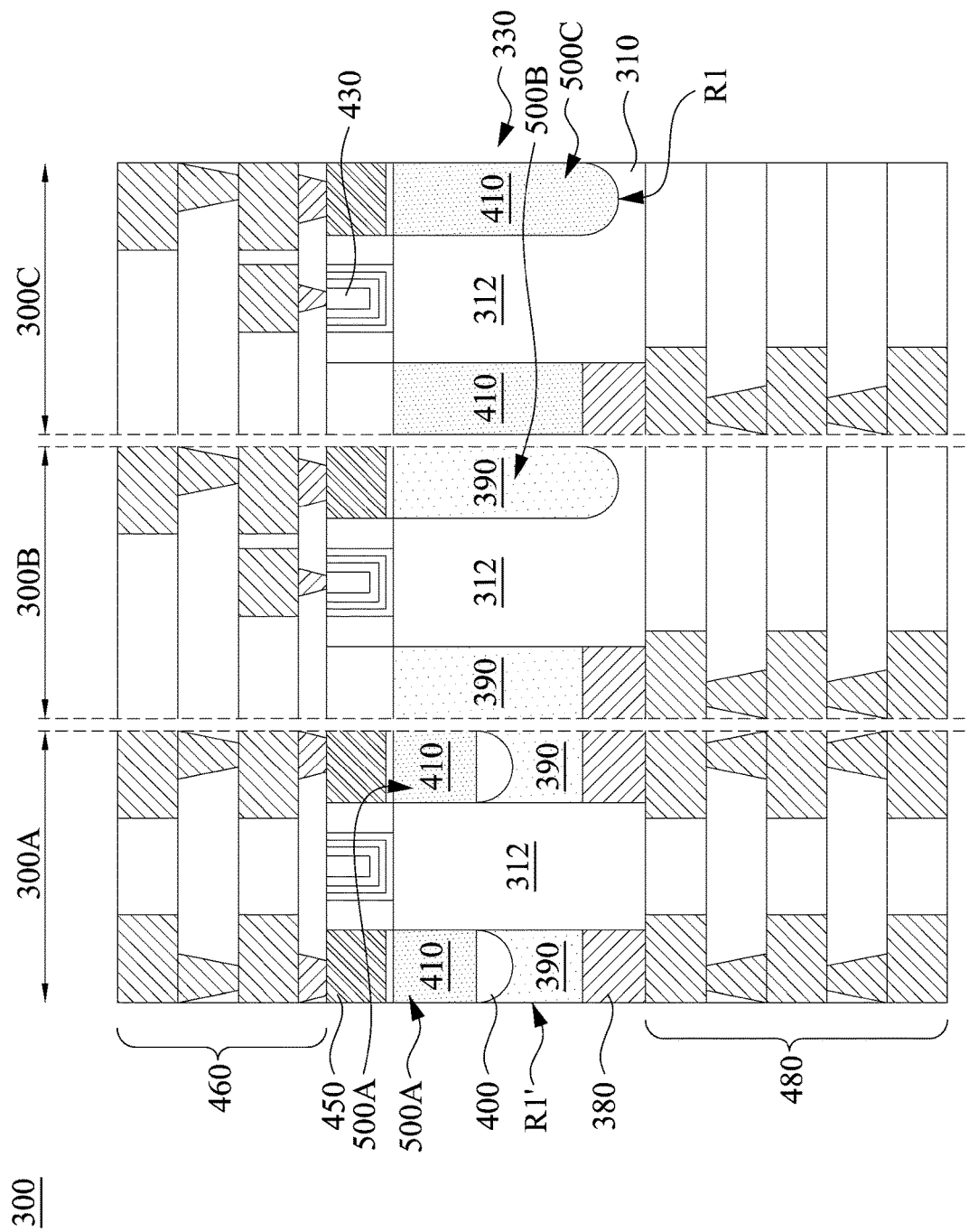
FIG. 24 is a cross-sectional view of an integrated circuit in accordance with some embodiments of the present disclosure.

FIG. 24 is a cross-sectional view of an integrated circuit 300 in accordance with some embodiments of the present disclosure. One difference between the present embodiments and the embodiments of FIG. 23 is that: the fins 330 includes a substrate portion 312 formed from the substrate 310, and does not includes nanosheets 324 (referring to FIG. 23). In the present embodiments, the PFET device 500B and the NFET device 500C are FinFET devices, but not GAA devices.

In the present embodiments, the etching processes in FIGS. 7 and 9 are performed to resulting in recesses R1 and R1' in the substrate portion 312 of the substrate 310. The diode structure 500A is formed in the recesses R1' in the substrate portion 312 of the substrate 310. For example, top surfaces of the epitaxial features 400 and 410 may be below a top surface of the substrate portion 312. The same or similar configurations, materials, processes and/or operation as described in above embodiments may be employed in the present embodiments, and the detailed explanation may be omitted.

In some alternative embodiments, the substrate 310 may not include a fin structure (e.g., the substrate portion 312), and the recesses R1 and R1' are formed in the substrate 310. In the alternative embodiments, the PFET device 500B and the NFET device 500C may be planar transistor devices, but not FinFET or GAA devices.

Figure 25:
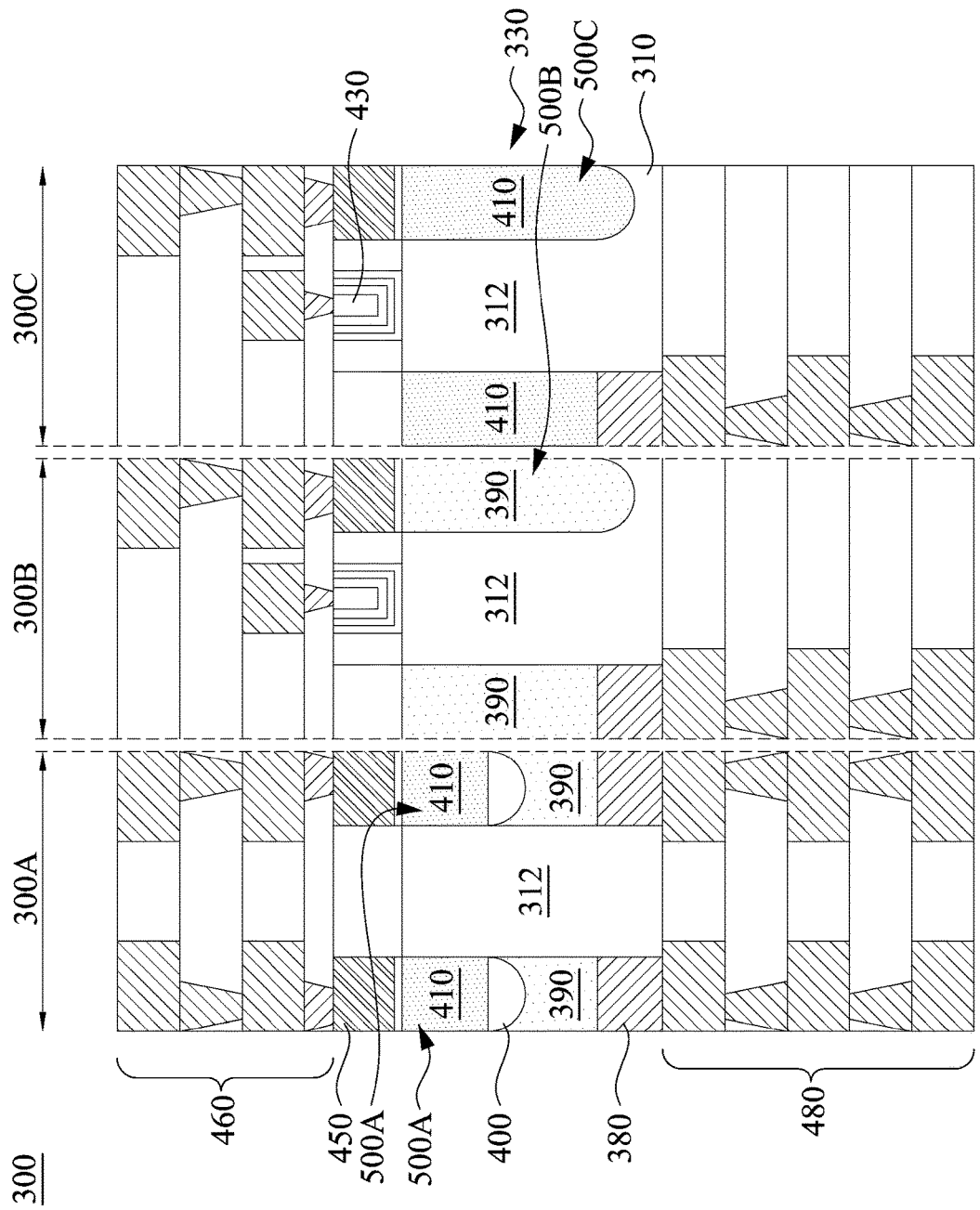
FIG. 25 is a cross-sectional view of an integrated circuit in accordance with some embodiments of the present disclosure.

FIG. 25 is a cross-sectional view of an integrated circuit in accordance with some embodiments of the present disclosure. One difference between the present embodiments and the embodiments of FIG. 24 is that: the gate structure 430 in the region 300A is omitted. In the present embodiments, two adjacent diode structures 500A are formed without a gate structure 430 (referring to FIG. 24) therebetween. In some alternative embodiments, a diode structure 500A and a dummy structure 500A' adjacent to the diode structure 500A (referring to FIG. 22) are formed without a gate structure 430 (referring to FIG. 22) therebetween. The same or similar configurations, materials, processes and/or operation as described in above embodiments may be employed in the present embodiments, and the detailed explanation may be omitted.

Figure 26A:
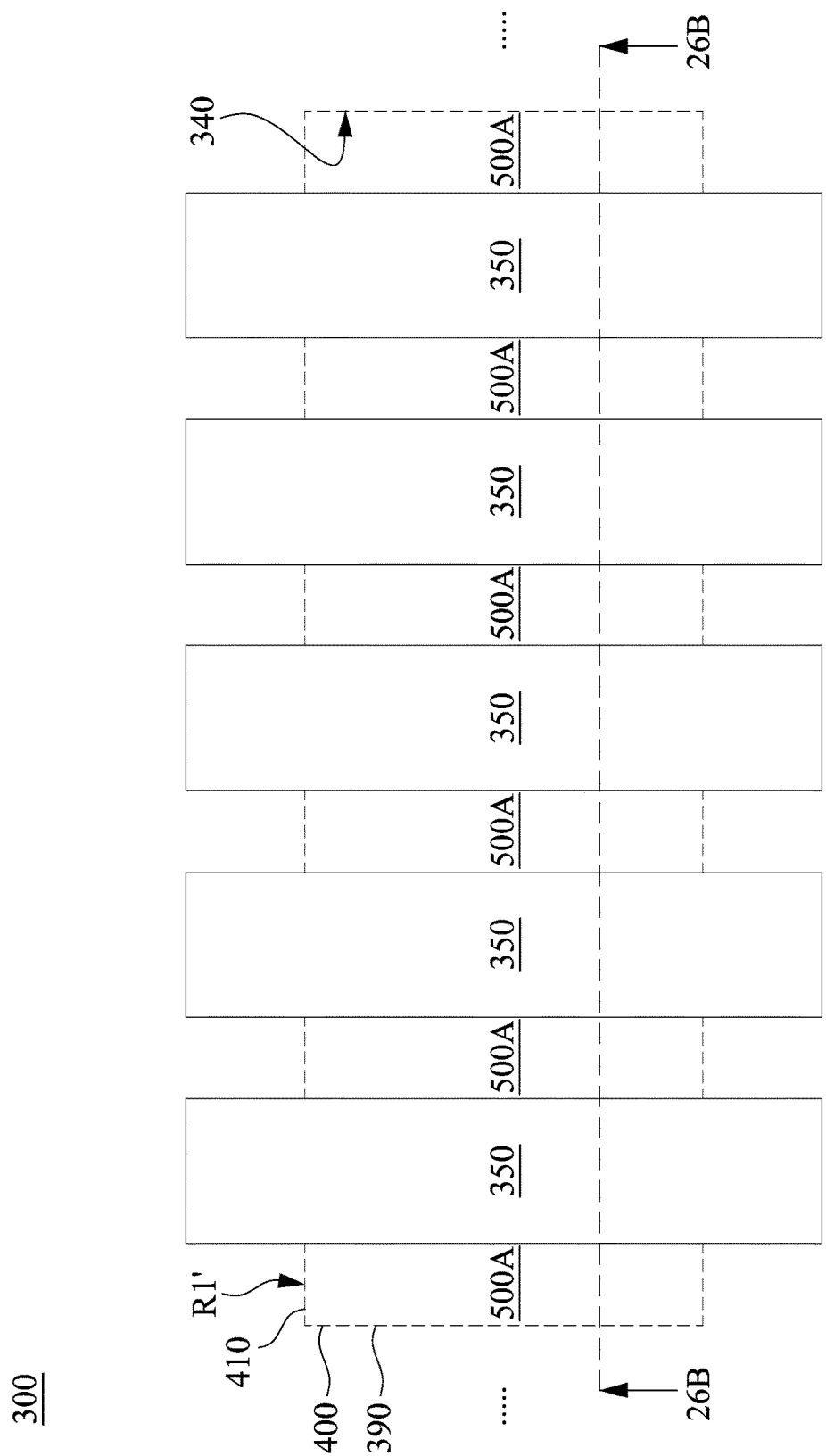
FIGS. 26A-27 illustrate various stages of manufacturing an integrated circuit according to some embodiments of the present disclosure.
Figure 26B:
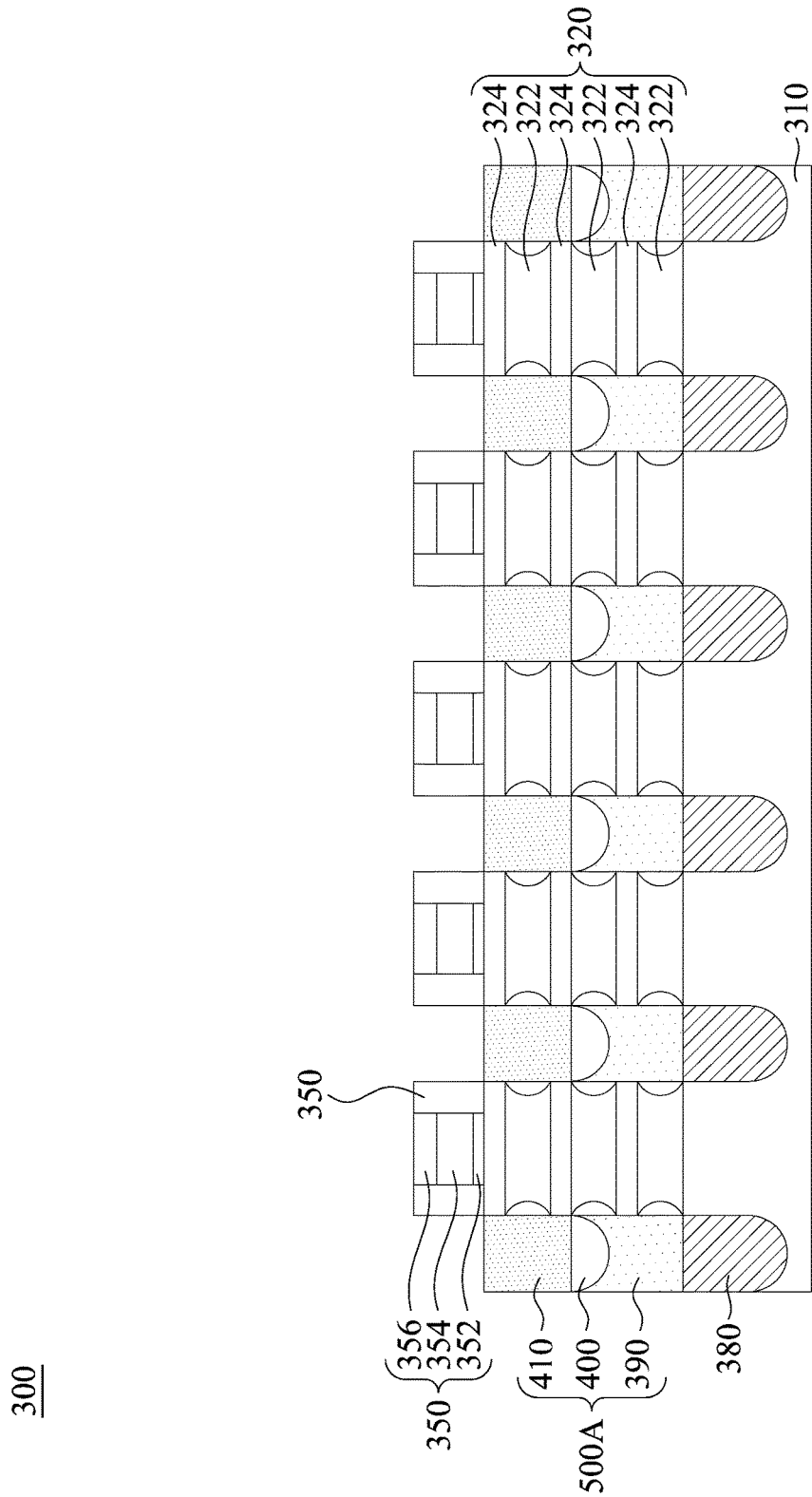
Figure 27:
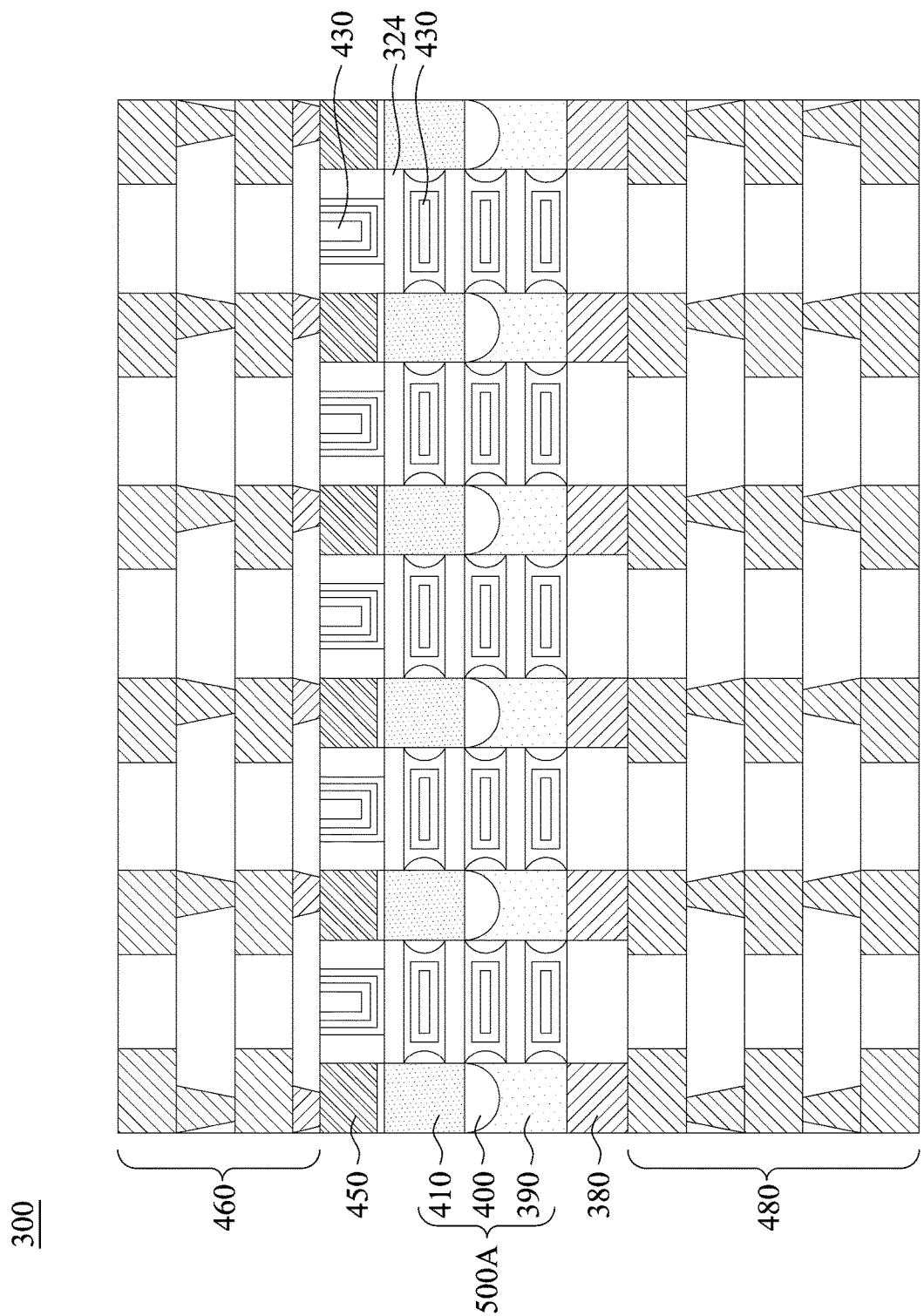

FIGS. 26A-27 illustrate various stages of manufacturing an integrated circuit according to some embodiments of the present disclosure. The illustration is merely exemplary and is not intended to limit beyond what is specifically recited in the claims that follow. It is understood that additional operations may be provided before, during, and after the operations shown by FIGS. 26A-27, and some of the operations described below can be replaced or eliminated for additional embodiments of the method. The order of the operations/processes may be interchangeable.

FIG. 26A is a top view of an integrated circuit 300 according to some embodiments of the present disclosure. FIG. 26B is a cross-sectional view taken along line 26B-26B in FIG. 26A. Reference is made to FIGS. 26A and 26B. The gate structures 350 are formed over the substrate 310, and the epitaxial features 390-410 are formed on opposite sides of the gate structures 350 as the step in FIG. 14. As shown in the figure, the epitaxial features 390-410 are vertically stacked and overlaps as viewed from top. The vertical stack configuration may save the chip area occupied by the diode structures 500A (e.g., the epitaxial features 390-410).

Referring to FIG. 27, contact 450, front-side MLI structure 460, and backside MLI structure 480 are respectively formed over the structure of FIG. 26B. Other details of the present embodiments are similar to those mentioned above, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that epitaxial features are vertically stack to form diode structures, thereby saving the chip area occupied by the diode structures. Another advantage is that the anode and the cathode of the diode structure are respectively disposed in the front-side MLI structure and the back-side MLI structure, thereby reducing the capacitance and resistance between the anode and the cathode of the diode structure. Still another advantage is that backside contact via is used for connecting the diode structure to desired power rail, thereby saving the routing space.

According to some embodiments of the present disclosure, a method for fabricating an integrated circuit is provided. The method includes etching a first recess in a semiconductor structure; forming a first doped epitaxial feature in the first recess; and forming a second doped epitaxial feature over the first doped epitaxial feature, wherein the second doped epitaxial feature has a conductive type opposite to a conductive type of the first doped epitaxial feature.

According to some embodiments of the present disclosure, a method for fabricating an integrated circuit is provided. The method includes forming a first conductive feature over a first region of a substrate; forming a first doped epitaxial feature over the first conductive feature; forming a second doped epitaxial feature over the first doped epitaxial feature, wherein the second doped epitaxial feature has a conductive type opposite to a conductive type of the first doped epitaxial feature; removing a portion of the substrate to expose a backside of the first conductive feature; and forming a backside metallization pattern connected with the backside of the first conductive feature.

According to some embodiments of the present disclosure, an integrated circuit includes a substrate, a backside contact via, a diode structure, a dielectric layer, and a frontside contact via. The backside contact via extends through a first region of the substrate. The diode structure is over the backside contact via. The diode structure comprises a first doped epitaxial feature and a second doped epitaxial feature over the first doped epitaxial feature, and the second doped epitaxial feature has a conductive type opposite to a conductive type of the first doped epitaxial feature. The backside contact via is connected with a backside of the first doped epitaxial feature. The dielectric layer is over the diode structure. The frontside contact via is in the dielectric layer and connected with the second doped epitaxial feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating an integrated circuit, comprising:
   etching a first recess in a semiconductor structure;
   forming a first doped epitaxial feature in the first recess;
   forming an intrinsic epitaxial feature over the first doped epitaxial feature; and
   forming a second doped epitaxial feature over the intrinsic epitaxial feature, wherein the second doped epitaxial feature has a conductive type opposite to a conductive type of the first doped epitaxial feature.

2. The method of claim 1, further comprising:
   forming a first conductive feature in the first recess prior to forming the first doped epitaxial feature.

3. The method of claim 2, further comprising:
   removing a portion of the semiconductor structure to expose a backside of the first conductive feature; and
   forming a backside metallization pattern connected with the backside of the first conductive feature.

4. The method of claim 1, further comprising:
   forming a second conductive feature over and connected with a frontside of the second doped epitaxial feature.

5. The method of claim 1, further comprising:
   forming a gate structure over the semiconductor structure prior to etching the first recess.

6. The method of claim 1, wherein the semiconductor structure comprises a substrate and an epitaxial stack over the substrate, etching the first recess is performed such that the first recess is etched in the epitaxial stack and the substrate, and forming the first doped epitaxial feature and forming the second doped epitaxial feature are performed such that the first and second doped epitaxial features are in the first recess in the epitaxial stack and the substrate.

7. The method of claim 1, wherein the semiconductor structure comprises a substrate, etching the first recess is performed such that the first recess is etched in the substrate, and forming the first doped epitaxial feature and forming the second doped epitaxial feature are performed such that the first and second doped epitaxial features are in the first recess in the substrate.

8. The method of claim 2, wherein the first conductive feature is made of a metal material.

9. The method of claim 1, further comprising:
   recessing the first doped epitaxial feature prior to forming the second doped epitaxial feature.

10. The method of claim 1, further comprising:
    etching a second recess in the semiconductor structure, wherein the first recess is deeper than the second recess; and
    forming a third doped epitaxial feature in the second recess.

11. A method for fabricating an integrated circuit, comprising:
    forming a first conductive feature over a first region of a substrate;
    forming a first doped epitaxial feature over the first conductive feature;
    forming a second doped epitaxial feature over the first doped epitaxial feature, wherein the second doped epitaxial feature has a conductive type opposite to a conductive type of the first doped epitaxial feature;

removing a portion of the substrate to expose a backside of the first conductive feature; and forming a backside metallization pattern connected with the backside of the first conductive feature.

12. The method of claim 11, wherein removing the portion of the substrate comprises:

performing a planarization process to a backside of the substrate until reaching the backside of the first conductive feature.

13. The method of claim 11, further comprising:

forming a gate structure over a second region of the substrate, wherein forming the first doped epitaxial feature is performed such that a third doped epitaxial feature is formed over a third region of the substrate adjacent to the second region of the substrate, wherein the third doped epitaxial feature has a conductive type the same as the conductive type of the first doped epitaxial feature.

14. The method of claim 11, further comprising:

forming a gate structure over a second region of the substrate, wherein forming the second doped epitaxial feature is performed such that a third doped epitaxial feature is formed over a third region of the substrate adjacent to the second region of the substrate, wherein the third doped epitaxial feature has a conductive type the same as the conductive type of the second doped epitaxial feature.

15. The method of claim 11, further comprising:

forming a second conductive feature over and connected with a frontside of the second doped epitaxial feature.

16. The method of claim 11, further comprising:

forming a gate structure over a second region of the substrate adjacent to the first region of the substrate prior to forming the first conductive feature.

17. An integrated circuit, comprising:

a substrate;

a backside contact via extending through a first region of the substrate;

a diode structure over the backside contact via, wherein the diode structure comprises a first doped epitaxial feature and a second doped epitaxial feature over the first doped epitaxial feature, and the second doped epitaxial feature has a conductive type opposite to a conductive type of the first doped epitaxial feature, wherein the backside contact via is connected with a backside of the first doped epitaxial feature;

a dielectric layer over the diode structure; and a frontside contact via in the dielectric layer and connected with the second doped epitaxial feature.

18. The integrated circuit of claim 17, further comprising:

a gate structure over a second region of the substrate adjacent to the first region of the substrate.

19. The integrated circuit of claim 18, further comprising:

a plurality of semiconductor layers over the substrate, wherein the gate structure surrounds the semiconductor layers.

20. The integrated circuit of claim 17, wherein the diode structure further comprises:

an intrinsic epitaxial feature between the first doped epitaxial feature and the second doped epitaxial feature.

* * * * *